United States Patent
Ikeda et al.

(10) Patent No.: US 11,427,475 B2
(45) Date of Patent: Aug. 30, 2022

(54) POLYCRYSTALLINE DIAMOND AND METHOD FOR MANUFACTURING SAME, SCRIBE TOOL, SCRIBE WHEEL, DRESSER, ROTATING TOOL, ORIFICE FOR WATER JET, WIRE DRAWING DIE, CUTTING TOOL, ELECTRODE, AND PROCESSING METHOD USING POLYCRYSTALLINE DIAMOND

(71) Applicant: Sumitomo Electric Industries, Ltd., Osaka (JP)

(72) Inventors: Kazuhiro Ikeda, Itami (JP); Keiko Arimoto, Itami (JP); Katsuko Yamamoto, Itami (JP); Hitoshi Sumiya, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 430 days.

(21) Appl. No.: 16/346,419

(22) PCT Filed: Nov. 29, 2017

(86) PCT No.: PCT/JP2017/042857
§ 371 (c)(1),
(2) Date: Apr. 30, 2019

(87) PCT Pub. No.: WO2018/101347
PCT Pub. Date: Jun. 7, 2018

(65) Prior Publication Data
US 2020/0062601 A1    Feb. 27, 2020

(30) Foreign Application Priority Data

Nov. 30, 2016    (JP) .............................. JP2016-232364

(51) Int. Cl.
*C01B 32/26*    (2017.01)
*C01B 32/205*    (2017.01)
(Continued)

(52) U.S. Cl.
CPC ............... *C01B 32/26* (2017.08); *B01J 3/062* (2013.01); *C01B 32/205* (2017.08); *C01B 32/21* (2017.08);
(Continued)

(58) Field of Classification Search
None
See application file for complete search history.

(56) References Cited

U.S. PATENT DOCUMENTS

2014/0186629 A1* 7/2014 Ikeda ...................... C01B 32/26
428/402

FOREIGN PATENT DOCUMENTS

EP    2738140 A1    6/2014
JP    7-299467 A    11/1995
(Continued)

OTHER PUBLICATIONS

U.S. Appl. No. 16/346,459, filed Apr. 30, 2019 [Provided in IFW].
(Continued)

*Primary Examiner* — Guinever S Gregorio
(74) *Attorney, Agent, or Firm* — Baker Botts L.L.P.; Michael A. Sartori

(57) ABSTRACT

Provided is polycrystalline diamond having a diamond single phase as basic composition, in which the polycrystalline diamond includes a plurality of crystal grains and contains boron, at least either of nitrogen and silicon, and a remainder including carbon and trace impurities; the boron is dispersed in the crystal grains at an atomic level, and greater than or equal to 90 atomic % of the boron is present in an isolated substitutional type; the nitrogen and the silicon are present in an isolated substitutional type or an interstitial type in the crystal grains; each of the crystal grains has a grain size of less than or equal to 500 nm; and the polycrystalline diamond has a surface covered with a protective film.

24 Claims, 4 Drawing Sheets

(51) Int. Cl.
    *C01B 32/21* (2017.01)
    *B01J 3/06* (2006.01)

(52) U.S. Cl.
    CPC ...... *C01B 2204/06* (2013.01); *C01P 2002/82* (2013.01); *C01P 2002/90* (2013.01)

(56) References Cited

FOREIGN PATENT DOCUMENTS

| JP | 2012-106925 A | 6/2012 |
|---|---|---|
| JP | 2013-028500 A | 2/2013 |
| JP | 2015-030646 A | 2/2015 |

OTHER PUBLICATIONS

Tachibana, T. et al., "Growth of polycrystalline diamond films including diborane and oxygen in the source gas," Journal of the Electrochemical Society, 1999, 4 pages.

\* cited by examiner

POLYCRYSTALLINE DIAMOND AND METHOD FOR MANUFACTURING SAME, SCRIBE TOOL, SCRIBE WHEEL, DRESSER, ROTATING TOOL, ORIFICE FOR WATER JET, WIRE DRAWING DIE, CUTTING TOOL, ELECTRODE, AND PROCESSING METHOD USING POLYCRYSTALLINE DIAMOND

TECHNICAL FIELD

The present invention relates to polycrystalline diamond and a method for manufacturing the same. The present application claims priority to Japan Patent Application Number 2016-232364 filed on Nov. 30, 2016. All contents disclosed in the Japanese application are all incorporated by reference herein in their entirety. The polycrystalline diamond according to the present invention is suitably used in a scribe tool, a scribe wheel, a dresser, a rotating tool, an orifice for water jet, a wire drawing die, a cutting tool, an electrode, and the like. The present invention further relates to a processing method using polycrystalline diamond.

BACKGROUND ART

It has recently been clarified that nano polycrystalline diamond (hereinafter, may be referred to as NPD) has a higher isotropic hardness than natural single-crystal diamond. Nano polycrystalline diamond to which conductivity has been imparted by adding a boron compound to such a material has been developed. Further, nano polycrystalline diamond which exhibits semiconductor properties based on a diamond structure has been developed by incorporating boron as a substitutional atom into a diamond crystal grain.

For example, Japanese Patent Laying-Open No. 2012-106925 (PTL1) proposes a diamond polycrystalline body in which a boron compound is contained as impurities and heated in the air to thereby form a protective film of boron oxide on a surface thereof so as to improve oxidation resistance. Japanese Patent Laying-Open No. 2013-028500 (PTL2) proposes nano polycrystalline diamond having p-type conductivity without containing a boron compound by incorporating a group III element of the Periodic Table as a substitutional atom in a diamond crystal grain.

CITATION LIST

Patent Literature

PTL1: Japanese Patent Laying-Open No. 2012-106925
PTL2: Japanese Patent Laying-Open No. 2013-028500

SUMMARY OF INVENTION

The polycrystalline diamond according to an aspect of the present invention is polycrystalline diamond having a diamond single phase as basic composition, wherein the polycrystalline diamond includes a plurality of crystal grains; the polycrystalline diamond contains boron, at least either of nitrogen and silicon, and a remainder including carbon and trace impurities; the boron is dispersed in the crystal grains at an atomic level, and greater than or equal to 90 atomic, of all the boron is present in an isolated substitutional type; the nitrogen and the silicon are present in an isolated substitutional type or an interstitial type in the crystal grains; each of the crystal grains has a grain size of less than or equal to 500 nm; and the polycrystalline diamond has a surface covered with a protective film.

A method for manufacturing polycrystalline diamond according to an aspect of the present invention includes a first step of preparing graphite containing carbon, boron, and at least either of nitrogen and silicon; a second step of filling the graphite in a vessel under an inert gas atmosphere; and a third step of converting the graphite to diamond by pressure heat treatment in the vessel, wherein the boron is dispersed in a crystal grain of the graphite at an atomic level, and greater than or equal to 90 atomic % of the boron is present in an isolated substitutional type.

DETAILED DESCRIPTION

Figure 1:
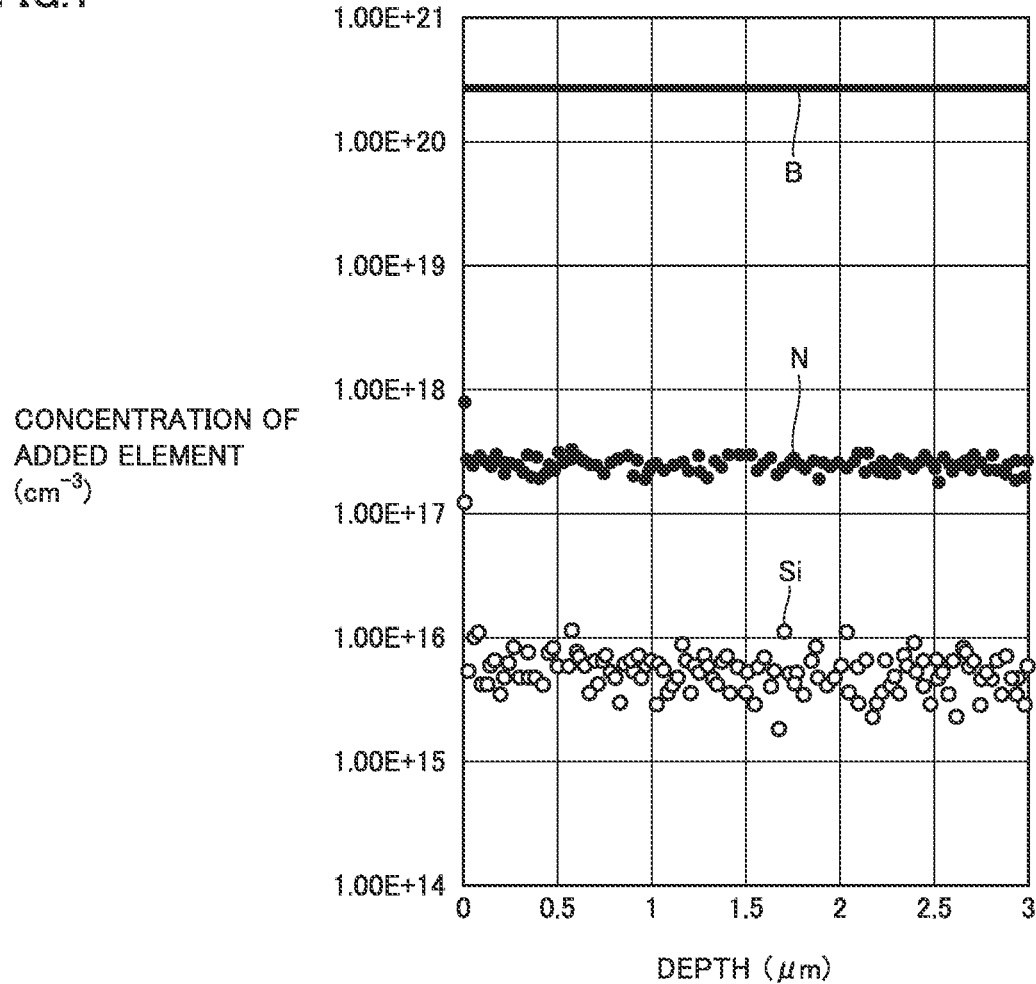
FIG. 1 is a graph showing an example of distribution of added elements inside a polycrystalline diamond according to the present embodiment.

Problem to be Solved by the Present Disclosure

The diamond polycrystalline body disclosed in PTL1, however, has had room for improvement in the following points: the boron compound is not contained in the diamond crystal lattice, so that the hardness deteriorates, and the boron compound has a different thermal expansion coefficient from diamond, so that a crack tends to occur at high temperature. The nano polycrystalline diamond disclosed in PTL2 has had room for improvement in terms of oxidation resistance because when a work material such as ceramics or resin containing oxygen is processed, the nano polycrystalline diamond is oxidized.

Further, in the case where an insulating work material is processed, triboplasma generates between conventional nano polycrystalline diamond and the work material, so that both the NPD and the work material have tended to be worn and torn. Further, since the protective film of boron oxide is water-soluble, the use of an aqueous cutting fluid has failed to exhibit its protective effect. Therefore, there has been a demand for nano polycrystalline diamond that is capable of suppressing generation of triboplasma while suppressing deterioration of hardness and occurrence of a crack, and that has a water-insoluble protective film formed thereon.

The present invention has been proposed in view of the above circumstances, and an object of the present invention is to provide polycrystalline diamond that has a water-insoluble protective film formed thereon while suppressing generation of triboplasma, and a method for manufacturing the same; a scribe tool, a scribe wheel, a dresser, a rotating tool, an orifice for water jet, a wire drawing die, a cutting tool, and an electrode that are formed using the polycrystalline diamond; and a processing method using the polycrystalline diamond.

Advantageous Effect of the Present Disclosure

According to the above, polycrystalline diamond that has a water-insoluble protective film thrilled thereon while suppressing triboplasma, and a method for manufacturing the same can be provided.

Description of Embodiments

First, embodiments of the present invention will be listed and described.

[1] The polycrystalline diamond according to an aspect of the present invention is polycrystalline diamond having a diamond single phase as basic composition, wherein the polycrystalline diamond includes a plurality of crystal grains; the polycrystalline diamond contains boron, at least either of nitrogen and silicon, and a remainder including carbon and trace impurities; the boron is dispersed in the crystal grains at an atomic level, and greater than or equal to 90 atomic % of all the boron is present in an isolated substitutional type; the nitrogen and the silicon are present in an isolated substitutional type or an interstitial type in the crystal grains; each of the crystal grains has a grain size of less than or equal to 500 nm; and the polycrystalline diamond has a surface covered with a protective film. With such a configuration, the polycrystalline diamond can have a water-insoluble protective film formed thereon while suppressing triboplasma.

[2] Greater than or equal to 99 atomic % of all the boron is preferably present in an isolated substitutional type in the crystal grains. Accordingly, triboplasma can further be suppressed.

[3] The boron preferably has an atomic concentration of greater than or equal to $1 \times 10^{14}$ cm$^{-3}$ and less than or equal to $1 \times 10^{22}$ cm$^{-3}$. Accordingly, triboplasma can further be suppressed.

[4] The nitrogen preferably has an atomic concentration of greater than or equal to $1 \times 10^{18}$ cm$^{-3}$ and less than or equal to $1 \times 10^{20}$ cm$^{-3}$. Accordingly, a water-insoluble protective film can be formed.

[5] The silicon preferably has an atomic concentration of greater than or equal to $1 \times 10^{18}$ cm$^{-3}$ and less than or equal to $2 \times 10^{20}$ cm$^{-3}$. Accordingly, a water-insoluble protective film can further be formed.

[6] In a Raman spectroscopic measurement of the polycrystalline diamond, a peak area around 1575 cm$^{-1}$±30 cm$^{-1}$ with a half width of greater than 10 cm$^{-1}$ and less than or equal to 20 cm$^{-1}$ is preferably less than 1% of a peak area around 1300 cm$^{-1}$±30 cm$^{-1}$ with a half width of less than or equal to 60 cm$^{-1}$. Accordingly, the polycrystalline diamond can maintain an isotropic hardness exceeding natural single-crystal diamond.

[7] The polycrystalline diamond preferably has a dynamic friction coefficient of less than or equal to 0.2. Accordingly, the polycrystalline diamond is suitable for a case of processing an insulating work material such as ceramics and resin.

[8] The polycrystalline diamond preferably has a dynamic friction coefficient of less than or equal to 0.1. Accordingly, the polycrystalline diamond is further suitable for a case of processing an insulating work material such as ceramics and resin.

[9] The protective film preferably contains at least silicon oxide or boron nitride. Accordingly, a water-insoluble protective film can be formed.

[10] The protective film preferably contains a precipitate precipitated out of the crystal grains. Accordingly, a water-insoluble protective film can further be formed.

[11] The protective film preferably has an average film thickness of greater than or equal to 1 nm and less than or equal to 1000 nm. Accordingly, a dynamic friction coefficient can be properly reduced.

[12] The polycrystalline diamond preferably contains a graphene nanoribbon. Accordingly, a graphene nanoribbon-derived protective film can be formed on the surface thereof.

[13] The polycrystalline diamond preferably has a peak at a Raman shift of 1554 cm$^{-1}$±20 cm$^{-1}$ with a half width of less than or equal to 10 cm$^{-1}$ in the Raman spectroscopic measurement. Accordingly, a graphene nanoribbon-derived protective film can be formed on the surface thereof.

[14] The polycrystalline diamond preferably has a peak at a Raman shift of 2330 cm$^{-1}$±20 cm$^{-1}$ with a half width of less than or equal to 6 cm$^{-1}$ in the Raman spectroscopic measurement. Accordingly, a graphene nanoribbon-derived protective film can be formed on the surface thereof.

[15] A method for manufacturing polycrystalline diamond according to an aspect of the present invention includes a first step of preparing graphite containing carbon, boron, and at least either of nitrogen and silicon; a second step of filling the graphite in a vessel under an inert gas atmosphere; and a third step of converting the graphite to diamond by pressure heat treatment in the vessel, wherein the boron is dispersed in a crystal grain of the graphite at an atomic level, and greater than or equal to 90 atomic % of the boron is present in an isolated substitutional type. With such a configuration, polycrystalline diamond that has a water-insoluble protective film formed thereon while suppressing triboplasma can be manufactured.

[16] The first step preferably includes a sub-step of forming a graphite base material containing the carbon and the boron on a base material by a vapor phase method. Accordingly, polycrystalline diamond that has a water-insoluble protective film formed thereon while suppressing triboplasma can be efficiently manufactured.

[17] The sub-step preferably further includes a semi-sub-step of including at least either of the nitrogen and the silicon in the graphite base material by the vapor phase method. Accordingly, polycrystalline diamond that has a water-insoluble protective film formed thereon while suppressing triboplasma can be more efficiently manufactured.

[18] The sub-step preferably further includes a semi-sub-step of including at least either of the nitrogen and the silicon in the graphite base material under vacuum condition. Accordingly, polycrystalline diamond that has a water-insoluble protective film formed thereon while suppressing triboplasma can be more efficiently manufactured.

[19] The first step preferably includes a sub-step of forming the graphite on the base material by simultaneously mixing the carbon, the boron, and at least either of the nitrogen and the silicon in vapor phase by the vapor phase method. Accordingly, polycrystalline diamond that has a water-insoluble protective film formed thereon while suppressing triboplasma can be further efficiently manufactured.

[20] It is preferable that the sub-step further includes a semi-sub-step including a step A and a step B; in step A, a gas mixture containing the carbon, the boron, and at least either of the nitrogen and the silicon is formed; in step B, the graphite is formed on the base material by thermally decomposing the gas mixture at a temperature of greater than or equal to 1200° C. and feeding the gas mixture toward the base material; and the carbon is included as a hydrocarbon gas. Accordingly, polycrystalline diamond that has a water-insoluble protective film formed thereon while suppressing triboplasma can be most efficiently manufactured.

[21] The hydrocarbon gas is preferably a methane gas. This can contribute to the efficient manufacturing of the polycrystalline diamond having the above-mentioned effect from the viewpoint of raw material.

[22] It is preferable that in the third step, the graphite can be directly subjected to pressure heat treatment in a pressure heat treatment apparatus. Accordingly, polycrystalline diamond having a diamond single phase as basic composition without containing a binding phase (binder) composed of cobalt or the like can be manufactured.

[23] The pressure heat treatment is preferably performed under conditions of greater than or equal to 6 GPa and greater than or equal to 1200° C. Accordingly, polycrystalline diamond having the above-mentioned effect can be efficiently manufactured.

[24] The pressure heat treatment is preferably performed under conditions of greater than or equal to 8 GPa and less than or equal to 30 GPa, and greater than or equal to 1500° C. and less than or equal to 2300° C. Accordingly, polycrystalline diamond having the above-mentioned effect can be more efficiently manufactured.

[25] An aspect of the present invention is preferably a scribe tool formed using the polycrystalline diamond. Accordingly, a scribe tool can be provided using the polycrystalline diamond that has a water-insoluble protective film formed thereon while suppressing triboplasma.

[26] An aspect of the present invention is preferably a scribe wheel formed using the polycrystalline diamond. Accordingly, a scribe wheel can be provided using the polycrystalline diamond that has a water-insoluble protective film formed thereon while suppressing triboplasma.

[27] An aspect of the present invention is preferably a dresser formed using the polycrystalline diamond. Accordingly, a dresser can be provided using the polycrystalline diamond that has a water-insoluble protective film formed thereon while suppressing triboplasma.

[28] An aspect of the present invention is preferably a rotating tool formed using the polycrystalline diamond. Accordingly, a rotating tool can be provided using the polycrystalline diamond that has a water-insoluble protective film formed thereon while suppressing triboplasma.

[29] An aspect of the present invention is preferably an orifice for water jet formed using, the polycrystalline diamond. Accordingly, an orifice for water jet can be provided using the polycrystalline diamond that has a water-insoluble protective film formed thereon while suppressing triboplasma.

[30] An aspect of the present invention is preferably a wire drawing die formed using the polycrystalline diamond. Accordingly, a wire drawing die can be provided using the polycrystalline diamond that has a water-insoluble protective film formed thereon while suppressing triboplasma.

[31] An aspect of the present invention is preferably a cutting tool formed using the polycrystalline diamond. Accordingly, a cutting tool can be provided using the polycrystalline diamond that has a water--insoluble protective film formed thereon while suppressing triboplasma.

[32] An aspect of the present invention is preferably an electrode formed using the polycrystalline diamond. Accordingly, an electrode can be provided using the polycrystalline diamond that has a water-insoluble protective film formed thereon while suppressing triboplasma.

[33] The processing method according to an aspect of the present invention is preferably a method of processing an object using the polycrystalline diamond. Accordingly, an object can be processed using the polycrystalline diamond that has a water-insoluble protective film formed thereon while suppressing triboplasma.

[34] The object is preferably an insulator. Accordingly, a triboplasma-suppressing effect that the polycrystalline diamond has can be suitably exhibited.

[35] The insulator preferably has a resistivity of greater than or equal to 100 kΩ·cm. Accordingly, the triboplasma-suppressing effect that the polycrystalline diamond has can be more suitably exhibited.

DETAILS OF EMBODIMENTS OF INVENTION

Embodiments according to the present invention will be described in further detail below. Here, the notation "A to B" in this specification means upper and lower limits of the range greater than or equal to A and less than or equal to B), and in the case where not A but only B is expressed in units, the unit of A is the same as that of B.

Further, unless an atomic ratio is not particularly limited when a compound or the like is represented by a chemical formula in this specification, the compound has any previously known atomic ratio, and the atomic ratio should not be limited only to one in a stoichiometric range. For example, in the case of description as "SiN", the ratio of atom number composing SiN is not limited to, for example, Si:N=1:1, and may include any previously known atomic ratio. The same applies to the descriptions of compounds other than "SiN". In the present embodiment, metalloid elements such as boron (B) and silicon (Si), and non-metal elements such as nitrogen (N) and carbon (C) do not necessarily have the stoichiometric composition.

<Polycrystalline Diamond>

The polycrystalline diamond according to the present embodiment has a diamond single phase as basic composition and includes a plurality of crystal grains. Further, the polycrystalline diamond contains boron, at least either of nitrogen and silicon, and the remainder including carbon and trace impurities. The boron is dispersed in the crystal grains at an atomic level, and greater than or equal to 90 atomic % of all the boron is present in an isolated substitutional type. The nitrogen and the silicon are present in an isolated substitutional type or an interstitial type in the crystal grains. The polycrystalline diamond has a grain size of less than or equal to 500 nm and has a surface covered with a protective film. Further, in the polycrystalline diamond according to the present embodiment, both the nitrogen and the silicon are preferably present in an isolated substitutional type or an interstitial type in the crystal grains.

Since the polycrystalline diamond according to present embodiment has a diamond single phase as basic composition, it does not contain a binding phase (binder) composed of both or one of a sintering aid and a catalyst, and grain dropping does not occur due to the difference in thermal expansion coefficient even under a high temperature condition. Further, since the polycrystalline diamond is a polycrystal formed of a plurality of crystal grains and has a grain size of less than or equal to 500 nm, it does not have orientation and cleavage properties like a single crystal and has hardness that is isotropic in all directions and wear resistance. Since the polycrystalline diamond contains boron and at least either of nitrogen and silicon in the crystal grains, the surface thereof is covered with a water-insoluble protective film. Accordingly, the oxidation resistance increases, and the dynamic friction coefficient is reduced, which in turn improves sliding properties and wear resistance.

From the viewpoints of having hardness that is isotropic in all directions and wear resistance, the polycrystalline diamond has the maximum grain size (the largest of the crystals composing the polycrystal) of less than or equal to 500 nm. The maximum grain size of the polycrystalline diamond is preferably less than or equal to 200 nm. On the other hand, the minimum grain size of the polycrystalline diamond may be greater than or equal to 1 nm.

The polycrystalline diamond having a grain size of less than or equal to 500 nm can obtain an effect of having isotropic hardness. Further, the polycrystalline diamond having a grain size of greater than or equal to 1 nm can obtain an effect of having mechanical strength specific to diamond. The polycrystalline diamond has more preferably a grain size of greater than or equal to 20 nm and less than or equal to 200 nm. In addition, it is more preferable that an aspect ratio of a major axis a to a minor axis b of each grain satisfies the relationship of a/b<4.

The grain size of the polycrystalline diamond can be measured by electron microscopy such as SEM or TEM. Any surface of the polycrystalline diamond is polished to prepare a polished surface for observation for the measurement of the grain size. Then, any one location (one visual field) on the polished surface for observation is observed, for example, using SEM at a magnification of 20000. Since approximately 120 to 200000 crystal grains of the polycrystalline diamond appear in one visual field, 10 of those crystal grains are measured to determine their grain sizes, and it is confirmed that all of them have a grain size of less than or equal to 500 nm. Such measurement is performed on all of the visual fields in all sample sizes, and therefore, it can be confirmed that the polycrystalline diamond has a grain size of less than or equal to 500 nm.

The grain size of the polycrystalline diamond can also be measured by an X-ray diffraction method (XRD method) based on the following conditions. Measuring apparatus: Trade name (product number) "X'pert", manufactured by PANalytical B.V.
X-ray light source: Cu-Kα ray (wave length: 1.54185 Å)
Scan axis: 2θ
Scan range: 20° to 120°
Voltage: 40 kV
Current: 30 mA
Scan speed: 1°/min
The half width was determined by the Scherrer's equation (D=Kλ/B cos θ) through peak fitting. Here, D is a crystal grain size of the diamond; B is a diffraction line width; λ is an X-ray wavelength; θ is a Bragg angle; K is a correction factor (0.9) determined by correlation with an SEM image.

<Elements in the Crystal Grains>

The polycrystalline diamond contains boron, at least either of nitrogen and silicon, and the remainder including carbon and trace impurities. The boron is dispersed in the crystal grains of the polycrystalline diamond at the atomic level, and greater than or equal to 90 atomic % of all the boron is present in an isolated substitutional type. At least either of nitrogen and silicon, preferably both of nitrogen and silicon is are present in an isolated substitutional type or an interstitial type in the crystal grains of the polycrystalline diamond. From the foregoing, a reaction between the boron and at least either of the nitrogen and the silicon that are exposed to the surface of the polycrystalline diamond from inside the polycrystalline diamond, and a reaction between these elements and the oxygen in the air, and the like proceed to thereby form a protective film, and the surface of the polycrystalline diamond is covered with the protective film. With the protective film, the oxidation resistance of the polycrystalline diamond is increased, and the protective film reduces the dynamic friction coefficient, so that the sliding properties and the wear resistance are improved. In the present embodiment, the protective film may contain a precipitate formed by being precipitated onto the surface of the polycrystalline diamond from inside the polycrystalline diamond.

In the polycrystalline diamond, since the boron is dispersed at the atomic level and greater than or equal to 90 atomic % of all the boron is present in an isolated substitutional type. Therefore, when the surface of the polycrystalline diamond is worn or the like, the boron exposed is oxidized, so that an oxide film is formed as a protective film only on the surface of the polycrystalline diamond, and a diamond structure is maintained inside the polycrystalline diamond, that is, in the crystal grains. The boron does not aggregate as clusters in the crystal grains of the polycrystalline diamond, and also does riot aggregate at a crystal grain boundary of the polycrystalline diamond. Therefore, there is no segregation of impurities that could be a starting point of a crack due to temperature change and/or impact. Further, the polycrystalline diamond has conductivity and also has a surface energy reduced by the protective film on the surface thereof, so that electrons are likely to be attracted inwardly. This contributes to suppression of triboplasma.

The phrase "dispersed at the atomic level" as used herein refers to dispersion of different elements such as boron in carbon that forms a crystal grain of polycrystalline diamond, each element having a finite activation energy (temperature-dependent electrical resistance), without changing the diamond crystal structure, or such a level of the dispersed state. That is, such a dispersed state is a state where different elements to be isolated and precipitated are not formed and a different compound other than diamond is not formed. The "isolated substitutional type" refers to an existence type in which different elements such as boron, nitrogen, and silicon are isolated and each substituted for carbon located at a lattice point of the polycrystalline diamond or graphite crystal lattice. The "interstitial type" refers to an existence type in which different elements such as nitrogen and silicon are entered into spaces between carbons located at lattice points of the polycrystalline diamond crystal lattice.

The dispersed state and existence type of boron, nitrogen, and silicon in the polycrystalline diamond according to the present embodiment can be observed with a transmission electron microscope (TEM) or a high-resolution transmission electron microscope (HRTEM). It can be confirmed by a time-of-flight secondary ion mass spectrometry (TOF-SIMS) that the boron is "dispersed at the atomic level" and an "isolated substitutional type". The existence of the nitrogen and the silicon in an "isolated substitutional type" or an "interstitial type" can be evaluated by TOF-SIMS.

With the TEM used for confirmation of the dispersed state and existence type as described above, the polished surface for observation for measuring the grain size of the polycrystalline diamond can be confirmed by observing any ten locations visual fields) on the polished surface for observation at a magnification of 20000 to 100000.

Using TOF-SIMS, for example, analysis can be performed under the following conditions, so that it can be confirmed that each of the elements is "dispersed at the atomic level" and that each of the elements is an "isolated substitutional type" or an "interstitial type".

Measuring apparatus: Time-of-flight secondary ion mass spectrometer (Tof-SIMS)
Primary ion source: Bismuth (Bi)
Primary acceleration voltage: 25 kV Greater than or equal to 90 atomic % of all the boron, or preferably greater than or equal to 95 atomic % of all the boron is present in an isolated substitutional type in the crystal grains of the polycrystalline diamond. More preferably greater than or equal to 99 atomic % of all the boron, or most preferably 100 atomic % of all the boron is present in an isolated substitutional type in the crystal grains of the polycrystalline diamond. The ratio of the isolated substitutional boron to the whole boron in the crystal grains of the polycrystalline diamond can be determined by measuring electrical conductivity and by C-V measurement. Since greater than or equal to 90 atomic % of all the boron is present in an isolated substitutional type in the crystal grains of the polycrystalline diamond, the polycrystalline diamond has higher hardness than cubic boron nitride having a Knoop hardness of approximately 50 GPa and an Ib-type diamond single crystal having a Knoop hardness of approximately 90 GPa. Therefore, the polycrystalline diamond is sufficiently useful for applications taking advantage of wear resistance properties (e.g., for dies, fir scribe tools, etc.). When the ratio of the isolated substitutional boron to the whole boron in the crystal grains of the polycrystalline diamond is less than 90 atomic %, aggregated boron does not compose a diamond structure and becomes a starting point of breaking, so that a break or a crack is likely to occur.

(Boron Atom Concentration)

From the viewpoint of forming a suitable protective film on the surface of the polycrystalline diamond and, from the viewpoint of setting the grain size of the polycrystalline diamond to less than or equal to 500 nm, the boron preferably has an atomic concentration of greater than or equal to $1 \times 10^{14}$ cm$^{-3}$ and less than or equal to $1 \times 10^{22}$ cm$^{-3}$, and more preferably greater than or equal to $1 \times 10^{14}$ cm$^{-3}$ and less than or equal to $1 \times 10^{21}$ cm$^{-3}$. When the boron has the more preferable atomic concentration, the defective rate of the protective film is drastically reduced and the yield of the polycrystalline diamond increases from greater than or equal to 30% to greater than or equal to 90%, as compared with the boron having the preferable atomic concentration. From the viewpoint of imparting conductivity for suppressing triboplasma, the boron preferably has an atomic concentration of greater than or equal to $1 \times 10^{14}$ cm$^{-3}$ and less than or equal to $1 \times 10^{22}$ cm$^{-3}$.

Polycrystalline diamond with boron having an atomic concentration of less than $1 \times 10^{19}$ cm$^{-3}$ exhibits electrical properties of a p-type semiconductor, and polycrystalline diamond with boron having an atomic concentration of greater than or equal to $1 \times 10^{19}$ cm$^{-3}$ exhibits electrical properties of a metallic conductor. Therefore, the boron further preferably has an atomic concentration of greater than or equal to $1 \times 10^{18}$ cm$^{-3}$ and less than or equal to $1 \times 10^{20}$ cm$^{-3}$.

When the boron has an atomic concentration of greater than or equal to $1 \times 10^{14}$ cm$^{-3}$, a triboplasma-suppressing effect can be obtained, and when the boron has an atomic concentration of less than or equal to $1 \times 10^{22}$ cm$^{-3}$, an effect of preventing the crystal grains from dropping can be obtained.

(Nitrogen Atom Concentration)

From the viewpoint of stably containing nitrogen in the crystal grains to suitably form a water-insoluble protective film on the surface of the polycrystalline diamond, and from the viewpoint of suppressing deterioration of hardness and increase of the grain size, the nitrogen preferably has an atomic concentration of greater than or equal to $1 \times 10^{18}$ cm$^{-3}$ and less than or equal to $1 \times 10^{20}$ cm$^{-3}$, and more preferably greater than or equal to $1 \times 10^{18}$ cm$^{-3}$ and less than or equal to $1 \times 10^{19}$ cm$^{-3}$.

With the nitrogen having an atomic concentration of greater than or equal to $1 \times 10^{15}$ cm$^{-3}$, an effect of being capable of forming a protective film of BN and SiN on the surface of the polycrystalline diamond can be obtained. With the nitrogen having an atomic concentration of less than or equal to $1 \times 10^{20}$ cm$^{-3}$, an effect of being capable of maintaining the hardness without aggregation can be obtained.

(Silicon Atom Concentration)

From the viewpoint of stably containing silicon in the crystal grains to suitably form a water-insoluble protective film on the surface of the polycrystalline diamond, and from the viewpoint of suppressing deterioration of hardness and increase of the grain size, the silicon preferably has an atomic concentration of greater than or equal to $1 \times 10^{18}$ cm$^{-3}$ and less than or equal to $2 \times 10^{20}$ cm$^{-3}$, and more preferably greater than or equal to $1 \times 10^{18}$ cm$^{-3}$ and less than or equal to $1 \times 10^{19}$ cm$^-$.

With the silicon having an atomic concentration of greater than or equal to $1 \times 10^{18}$ cm$^{-3}$, an effect of being capable of forming a protective film of SiN on the surface of the polycrystalline diamond can be obtained. With the silicon having an atomic concentration of less than or equal to $2 \times 10^{20}$ cm$^{-3}$, an effect of being capable of maintaining the hardness without aggregation can be obtained.

(Concentration of Trace Impurities)

The trace impurities contained in the polycrystalline diamond collectively refers to compounds which may be contained in trace amounts during manufacturing of the polycrystalline diamond. The content of each of the compounds contained as the trace impurities (atomic concentration) is greater than or equal to 0 cm$^{-3}$ and less than or equal to $1 \times 10^{18}$ cm$^{-3,}$ and the total content of each of the elements (i.e., content of the trace impurities (atomic concentration)) is greater than or equal to 0 cm$^{-3}$ and less than or equal to $1 \times 10^{22}$ cm$^{-3}$. Therefore, the trace impurities may or may not be contained in the polycrystalline diamond. The trace impurities include a metal element categorized as a transition metal element, and the like.

The secondary ion mass spectrometry (SIMS) can measure the concentrations of the boron, the nitrogen, and the silicon inside the polycrystalline diamond, and the TOF-SIMS can measure those concentrations on the surface and in the vicinity of the polycrystalline diamond (e.g., the protective film and the polycrystalline diamond in the vicinity of the protective film, from the surface to a depth of 100 nm), under the above-described conditions. The concentration of the trace impurities formed of elements other than the carbon, the boron, the nitrogen, and the silicon can be measured by SIMS and inductively coupled plasma-mass spectrometry (ICP-MS).

With SIMS, for example, analysis can be performed under the following conditions, so that the atomic concentrations of the boron, the nitrogen, and the silicon, and the atomic concentration of the trace impurities inside the polycrystalline diamond can be measured.

Measuring apparatus: Trade name (product number): "IMS-7f", manufactured by AMETEK Inc.
Primary ion species: Cesium (Cs$^|$)
Primary acceleration voltage: 15 kV
Detection area: 30 (μm φ)
Measurement accuracy: ±40%

FIG. 1 is a graph showing an example of distribution of added elements inside the polycrystalline diamond according to the present embodiment The distribution of added elements is measured using SIMS. The polycrystalline diamond shown in FIG. 1 is obtained in the following manner: under a vacuum atmosphere of $1\times10^{-2}$ Pa, nitrogen and silicon are added to a graphite base material containing carbon and boron formed on a base material by a chemical vapor deposition (CVD) method, to form graphite, and the graphite is directly converted to diamond by pressure heat treatment under conditions of 16 GPa and 2100° C. According to FIG. 1, it is understood that the polycrystalline diamond according to the present embodiment contains boron, nitrogen, and silicon at a uniform concentration from the surface to the inside thereof.

<Determination of Polycrystalline Diamond in Raman Spectroscopic Measurement>

In the Raman spectroscopic measurement of the polycrystalline diamond according to the present embodiment, the peak area around $1575\ cm^{-1}\pm30\ cm^{-1}$ with a half width of greater than $10\ cm^{-1}$ and less than or equal to $20\ cm^{-1}$ is preferably less than 1% of the peak area around $1300\ cm^{-1}\pm30\ cm^{-1}$ with a half width of less than or equal to $60\ cm^{-1}$. The area ratio is preferably less than 0.1%, and most preferably 0%. This shows that graphite carbon is substantially completely, or specifically, greater than or equal to 99 atomic % of graphite carbon is converted to diamond carbon. When the above area ratio is greater than or equal to 1%, the hardness of the polycrystalline diamond tends to be deteriorated. In the Raman spectroscopic measurement, a peak around $1575\ cm^{-1}\pm30\ cm^{-1}$ with a half width of greater than $10\ cm^{-1}$ and less than or equal to $20\ cm^{-1}$ is derived from amorphous carbon, graphite carbon, or sp2 carbon. A peak around $1300\ cm^{-1}\pm30\ cm^{-1}$ with a half width of less than or equal to $60\ cm^{-1}$ is derived from diamond carbon.

<Dynamic Friction Coefficient>

The polycrystalline diamond according to the present embodiment preferably has a dynamic friction coefficient of less than or equal to 0.2, more preferably less than or equal to 0.1, further preferably less than or equal to 0.05, and most preferably less than or equal to 0.02. Accordingly, the polycrystalline diamond can have high sliding properties and high wear resistance. When the dynamic friction coefficient of the polycrystalline diamond exceeds 0.2, the polycrystalline diamond tends not to have desired sliding properties and wear resistance.

The dynamic friction coefficient of the polycrystalline diamond can be measured by a pin-on-disk sliding test to be performed on the surface thereof under the following conditions.

Material of ball: SUS
Load: 10 N
Number of revolutions: 400 rpm
Sliding radius: 1.25 mm
Test time: 100 minutes
Temperature: Room temperature
Atmosphere: Air, Ar, or mineral oil In the case where the dynamic friction coefficient of the polycrystalline diamond is less than or equal to 0.2, it is reduced to less than or equal to 0.25 times that of polycrystalline diamond with no element added, for example, under dry atmosphere (e.g., at 25° C., a relative humidity of less than or equal to 40%). The dynamic friction coefficient of the polycrystalline diamond according to the present embodiment is preferably less than or equal to 0.2 times that of the polycrystalline diamond with no element added. The "polycrystalline diamond with no element added" as used herein refers to polycrystalline diamond in which boron, nitrogen, and silicon are not present in an isolated substitutional type in the crystal grains, and even in the case where these added elements are precipitated on the grain boundaries, the atomic concentrations of these elements do not exceed $1\times10^{18}\ cm^{-3}$.

<Protective Film>

In the polycrystalline diamond according to the present embodiment, the protective film preferably contains at least silicon oxide and boron nitride. It is considered that the silicon oxide is generated by allowing the silicon exposed to the surface from the crystal grain due to wear or the like to react with oxygen in the air, and then forms an oxide film as a protective film on the exposed surface. It is considered that the boron nitride is generated by allowing the nitrogen exposed to the surface from the crystal grain due to wear or the like to react with the boron exposed to the surface from the crystal grain as well, and then forms a protective film on the exposed surface. Both of the protective films have a lubricating function and a low dynamic friction coefficient, so that the sliding properties and wear resistance of the polycrystalline diamond can be improved. In particular, the silicon oxide and the boron nitride are both water-insoluble, so that they can exhibit a protective effect even in the case of using a water-soluble cutting fluid.

The protective film can contain a precipitate precipitated out of the crystal grains. The precipitate contains compounds such as boron, nitrogen, and silicon. It is considered that the compounds such as boron, nitrogen, and silicon are present in an interstitial type in the crystal grains of the polycrystalline diamond, and are exposed to the surface of the polycrystalline diamond due to wear or the like, to form precipitates. These precipitates also have a lubricating function, which thereby contributes to reduction in dynamic friction coefficient. Further, the silicon oxide and the boron nitride generated in the vicinity of the surface of the polycrystalline diamond or the like may form precipitates.

From the viewpoint that even though a grain having the maximum grain size drops due to mechanical damage, the protective film has a volume for filling a space formed by the dropping, the protective film has an average film thickness of greater than or equal to 1 nm and less than or equal to 1000 nm. The protective film more preferably has an average film thickness of greater than or equal to 20 nm and less than or equal to 500 nm. The protective film having an average film thickness of greater than or equal to 1 nm flattens minute surface roughness and exhibits individual lubricating effect, so that the sliding properties are improved. The protective film having an average film thickness of less than or equal to 1000 nm can provide an effect of advantageously performing mechanical cutting of an object to be cut by a diamond base.

Whether the protective film is formed on the surface of the polycrystalline diamond or not can be confirmed by auger electron spectroscopy (AES). For example, the polycrystalline diamond (boron concentration of $3.5\times10^{20}\ cm^{-3}$, nitrogen concentration of $5\times10^{18}\ cm^{-3}$, and silicon concentration of $1\times10^{18}\ cm^{-3}$) is chemically analyzed by AES to examine the presence or absence of oxygen in a surface layer from the surface to a depth of approximately 0.5 nm, so that the presence or absence of the protective film at room temperature can be confirmed.

Further, the average film thickness of the protective film on the surface of the polycrystalline diamond can be measured by a nano surface measuring apparatus (trade name: "Dektak XT", manufactured by the Bruker Corporation) or TEM. The measurement is performed, for example, with respect to a polished surface for observation used to measure the grain size of the polycrystalline diamond, by observing any five locations (five visual fields) on the polished surface for observation using TEM at a magnification of 20000. It should be noted that at the five locations, each of the visual fields includes a portion of the polycrystalline diamond surface. The thickness of the protective film portion on the polished surface for observation appeared in each of the visual fields is determined, and an average value thereof can be determined as the average film thickness.

<Graphene Nanoribbon>

The polycrystalline diamond according to the present embodiment preferably contains a graphene nanoribbon. Accordingly, a graphene nanoribbon-derived protective film can be formed on the surface of the polycrystalline diamond. In this case, the polycrystalline diamond preferably has a peak at a Raman shift of 1554 $cm^{-1} \pm 20$ $cm^{-1}$ with a half width of less than or equal to 10 $cm^{-1}$ in the Raman spectroscopic measurement. Further, the polycrystalline diamond more preferably has a peak at a Raman shift of 2330 $cm^{-1} \pm 20$ $cm^{-1}$ with a half width of less than or equal to 6 $cm^{-1}$ in the Raman spectroscopic measurement.

Specifically, according to the present embodiment, polycrystalline diamond containing a graphene nanoribbon may be obtained depending on the conditions for the manufacturing method to be described later. In this case, the graphene nanoribbon is preferably present in close vicinity to the surface of the polycrystalline diamond. Accordingly, when the graphene nanoribbon appears on the surface of the polycrystalline diamond, it reacts with oxygen in the air or oxygen in the crystal grains to become an oxide, so that the graphene nanoribbon-derived protective film can be formed on the surface of the polycrystalline diamond. Since the graphene nanoribbon-derived protective film improves the sliding properties and reduces the dynamic friction coefficient, wear resistance can be improved. In particular, it can contribute to set the dynamic friction coefficient to less than or equal to 0.02. Further, even though the graphene nanoribbon-derived protective film is simultaneously present with the above-described silicon oxide and boron nitride that form the other protective film on the surface of the polycrystalline diamond, they are not interfered with one another, which may not affect their sliding properties.

Methods for evaluating the properties (hardness, wear resistance, and resistivity) of the polycrystalline diamond according to the present embodiment are as follows.

(Evaluation of Hardness)

The hardness of the polycrystalline diamond can be evaluated by measuring Knoop hardness in conformity with JIS Z2251:2009. The Knoop hardness is measured, for example, with a load of 4.9 N. In the polycrystalline diamond according to the present embodiment, it is considered that the boron, the nitrogen, the silicon, and the like present in the crystal grains become starting points of plastic deformation and somewhat reduce the hardness to less than that of the polycrystalline diamond with no element added. However, as shown in Table 1 to be described later, the Knoop hardness of the polycrystalline diamond according to the present embodiment (e.g., B-NPD-III, boron concentration of $5 \times 10^{20}$ $cm^{-3}$, nitrogen concentration of $8 \times 10^{19}$ $cm^{-3}$, silicon concentration of $2 \times 10^{20}$ $cm^{-3}$) is equivalent to or higher than the Knoop hardness of a synthetic single-crystal diamond (Ib-type SCD).

(Evaluation of Wear Resistance)

Further, the wear resistance of the polycrystalline diamond can be evaluated by the following method. That is, polycrystalline diamond is processed into a work body having a cylindrical shape of 1 mm×1 mm×2 mm, a metal bond diamond wheel #800 (the number (#) means a mesh size, and the larger the number, the finer the grain that passes through the sieve) is used to perform a wear test (a load of 2.5 $kg/mm^2$, a sliding speed of 200 mm/min). At this time, it is evaluated that the polycrystalline diamond has a wear rate of 0.01±0.002 μm/min.

Further, during the wear test, mechanical wear and thermochemical wear synergistically proceed, so that it is desirable that the mechanical wear properties and the thermochemical wear properties are respectively evaluated as described below.

For evaluation of the mechanical wear properties of the polycrystalline diamond, a low-speed and long-time sliding test is performed with aluminum oxide ($Al_2O_3$) in which mechanical wear proceeds. For example, a frustoconical test piece having a φ0.3 mm-diameter test face at its tip end is fabricated using polycrystalline diamond. Next, this test piece is pressed against a sintered $Al_2O_3$ body (a purity of 99.9% by mass) under a constant load of 0.3 MPa by a machining center, and slid at a low speed of 5 m/min for a distance of 10 km, and an amount of wear is calculated from the extent of the tip end diameter, to evaluate the mechanical wear properties of the polycrystalline diamond. The amount of wear of the polycrystalline diamond according to the present embodiment is approximately 0.05 times as large as that of the polycrystalline diamond with no element added, so that the wear resistance is significantly improved. It is considered that the protective film formed on the surface is regenerated in turn by the wear of the polycrystalline diamond, and at each time, the sliding properties are significantly improved by the lubricating effect, so that the mechanical wear is remarkably suppressed.

For evaluation of the thermochemical wear properties of the polycrystalline diamond, a sliding test is performed against silicon dioxide ($SiO_2$) in which thermochemical wear proceeds. For example, a frustoconical test piece having a φ0.3 mm-diameter test face at its tip end is fabricated using polycrystalline diamond. Next, the test piece is fixed and a φ20 mm-diameter synthetic quartz ($SiO_2$) is pressed against the test face with a load of 0.1 MPa a while the synthetic quartz is rotated at 6000 rpm (sliding speed of 260 to 340 m/min) as a grinder. This slides the test piece and a speed (wear rate) at which wear progresses is measured to evaluate the thermochemical wear properties of the polycrystalline diamond. The wear rate of the polycrystalline diamond decreases as compared with that of the polycrystalline diamond with no element added, so that the wear resistance is improved. It is considered that the protective film formed on the surface is regenerated in turn by the wear of the polycrystalline diamond, and at each time, the sliding properties are significantly improved by the lubricating effect, so that the mechanical wear is remarkably suppressed.

The conductivity of the polycrystalline diamond can be evaluated by measuring resistivity in the following method. That is, the surface of the polycrystalline diamond is mirror-finished, and an electrode is used to measure resistivity of the mirror-finished body by a four-terminal method. This electrode is formed by annealing a Ti/Pt/Au laminated film in Ar at 320° C. In the present embodiment, five mirror-finished bodies described above are prepared and an average value of their resistivities is calculated, and the average value is preferably determined as the resistivity of the polycrystalline diamond.

In view of the above, the polycrystalline diamond according to the present embodiment has a water-insoluble protective film formed on the surface thereof and such a protective film can improve oxidation resistance, wear resistance, and sliding properties. Further, since the polycrystalline diamond has conductivity, abnormal wear and tear caused by triboplasma as seen in polycrystalline diamond with no element added, single--crystal diamond, and the like are also suppressed. Therefore, the polycrystalline diamond is suitable for processing of a hard-to-cut material such as cemented carbide or aluminum alloy, and can exhibit high performance for processing of an insulating object such as ceramics, plastics, glass, and quartz. In particular, the silicon oxide and the boron nitride that forms the protective film are both water-insoluble, so that they can exhibit a protective effect even in the case of using a water-soluble cutting fluid.

<<Method for Manufacturing Polycrystalline Diamond>>

Figure 2:
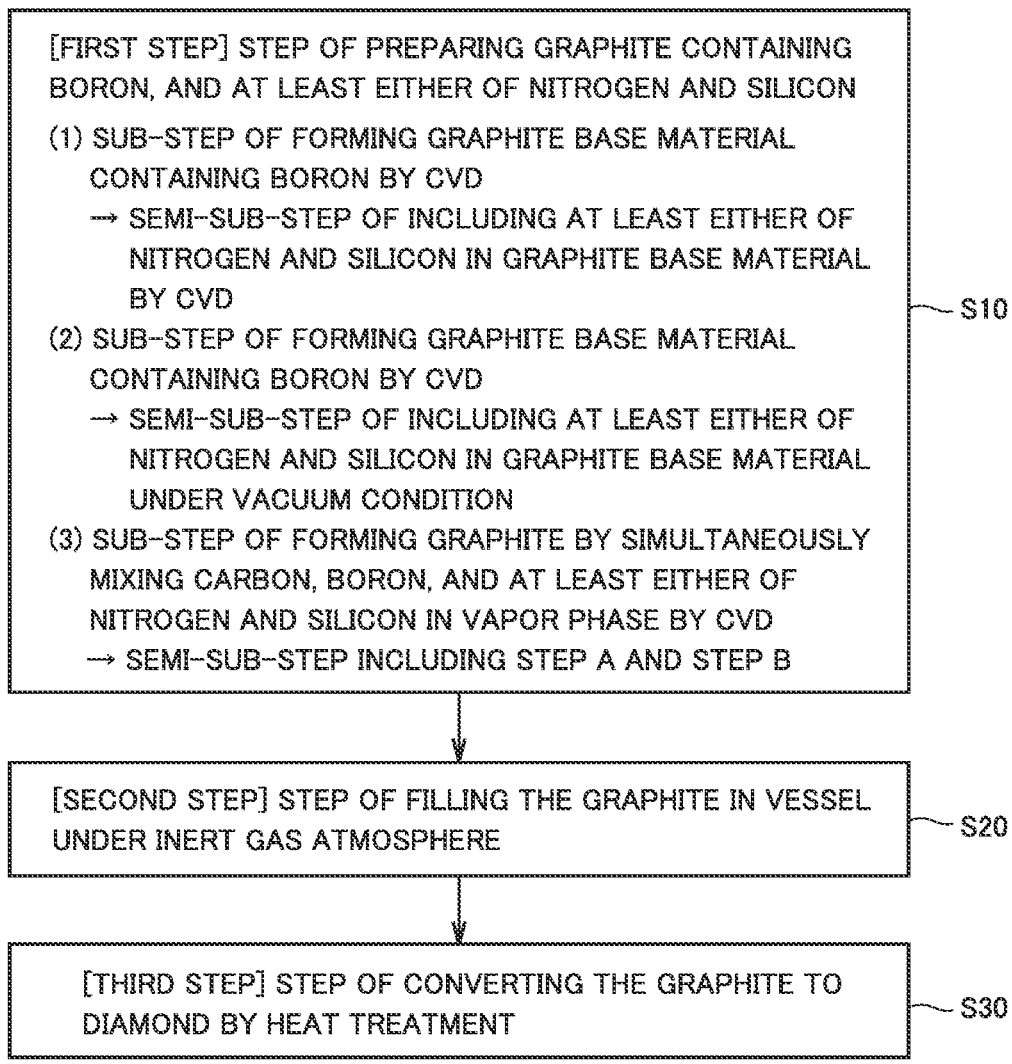
FIG. 2 is a flowchart showing steps in a method for manufacturing the polycrystalline diamond according to the present embodiment.

The method for manufacturing polycrystalline diamond according to the present embodiment includes a first step S10 of preparing graphite containing carbon, boron, and at least either of nitrogen and silicon; a second step S20 of filling the graphite in a vessel under an inert gas atmosphere; and a third step S30 of converting the graphite to diamond by pressure heat treatment in the vessel, as shown in FIG. 2. In particular, the boron is dispersed in a crystal grain of the graphite at an atomic level, and greater than or equal to 90 atomic % of the boron is present in an isolated substitutional type. With such a configuration, polycrystalline diamond having high oxidation resistance, high sliding properties, high wear resistance, and low dynamic friction coefficient can be manufactured.

The dispersed state and existence type of boron in the graphite base material and boron, nitrogen, and silicon in the graphite can be confirmed by the same method as that for confirming the dispersed state and existence type of these elements in the polycrystalline diamond. The element is "dispersed at the atomic level", "isolated substitutional type" or "interstitial type", the concentrations of boron, nitrogen, and silicon, and the concentration of trace impurities can also be confirmed by the same method as that for confirming them in the polycrystalline diamond.

<First Step>

First step S10 is a step of preparing graphite containing carbon, boron, and at least either of nitrogen and silicon, in which the boron is dispersed in a crystal grain of the carbon at the atomic level and greater than or equal to 90 atomic % of all the boron is present in an isolated substitutional type.

As shown in FIG. 2, a plurality of routes are available in first step S10, starting from raw materials of carbon, boron, nitrogen, and silicon to preparing graphite.

First, a first route (1) is as follows. Specifically, first step S10 preferably includes a sub-step of forming a graphite base material containing the carbon and the boron on a base material by a vapor phase method, from the viewpoint of efficiently fabricating graphite with high quality. The vapor phase method refers to a method of growing a crystal in a vapor phase state, and a CVD method is preferable, for example, from the viewpoint of efficiently fabricating graphite with high quality. In the CVD method, a carbon-containing gas and a boron-containing gas are preferably allowed to react on the base material at a temperature of greater than or equal to 1200° C. and less than or equal to 2500° C.

Conventionally, in the step of forming a graphite base material, when a method of forming a solid solution of boron in graphite with no element added is used, there has been a need for use of a non-graphite and non-diamond compound such as $B_4C$ in order to form a solid solution of boron in the graphite with no element added. Therefore, the higher the concentration of the carbon to be added is, the higher the concentration of the non-graphite and non-diamond compound such as $B_4C$ is required, so that impurities increase in the polycrystalline diamond, which thus deteriorate bond strength, that is, hardness of the polycrystalline diamond. In contrast to this, in the method for manufacturing polycrystalline diamond according to the present embodiment, the vapor phase method is used to manufacture polycrystalline diamond, so that high-quality polycrystalline diamond in which the rate of $B_4C$. incorporated is extremely low can be obtained. In the present embodiment, for example, when an X-ray diffraction method (XRD method) that has been used to measure the grain size of the polycrystalline diamond is applied, a $B_4C$-derived peak area that appears between 30° and 40° of a scan axis 2θ, relative to a peak area of diamond (111), is less than or equal to 0.1%.

The sub-step preferably further includes a semi-sub-step of including at least either of the nitrogen and the silicon in the graphite base material by the vapor phase method, from the viewpoint of efficiently fabricating graphite with high quality. At this time, also, a CVD method is preferably used as the vapor phase method. In the CVD method, both or either of a nitrogen-containing gas and a silicon-containing gas is/are preferably allowed to react with the graphite base material at a temperature of greater than or equal to 1200° C. and less than or equal to 2500° C.

Next, a second route (2) is as follows. Specifically, instead of the semi-sub-step by the vapor phase method, first step S10 can further include a semi-sub-step of including the nitrogen and the silicon in the graphite base material under vacuum condition. With this method, graphite with high quality can also be efficiently fabricated. The vacuum condition is preferably less than or equal to 1 Pa, and more preferably less than or equal to $10^{-1}$ Pa, from the viewpoint of reducing incorporation of trace impurities. The atmospheric temperature at this time is preferably less than or equal to 1200° C., and more preferably less than or equal to 1000° C. The method of including nitrogen and silicon in the graphite base material should not be particularly limited as long as it is performed under vacuum condition. For example, both or either of a nitrogen-containing gas and a silicon-containing gas is/are fed toward the graphite base material under vacuum condition, so that at least either of the nitrogen and the silicon can be included in the graphite base material.

Further, a third route (3) is as follows. Specifically, instead of the above-mentioned sub-step, first step S10 preferably includes a sub-step of forming the graphite on a base material by simultaneously mixing the carbon, the boron, and at least either of the nitrogen and the silicon in vapor phase by the vapor phase method, from the viewpoint of efficiently fabricating the graphite with high quality. At this time, also, a CVD method is preferably used as the vapor phase method. In the CVD method, a carbon-containing gas, a boron-containing gas, and both or either of a nitrogen-containing gas and a silicon-containing gas are preferably allowed to react on the base material at a temperature of greater than or equal to 1200° C. and less than or equal to 2500° C.

In particular, the sub-step in third route (3) preferably includes a semi-sub-step including a step A and a step B. In step A, a gas mixture containing the carbon, the boron, and at least either of the nitrogen and the silicon is formed. In step B, the gas mixture is thermally decomposed at a temperature of greater than or equal to 1200° C. and is fed toward the base material, to form the graphite on the base material. The carbon is preferably included as a hydrocarbon gas.

As the gas mixture, specifically, a gas mixture containing diborane gas, silane gas, cyanogen gas, and methane gas or ethane gas is preferable. This allows boron, nitrogen, and silicon to be uniformly added to the graphite at an atomic level. Further, by controlling the amount of diborane, silane, and cyanogen to be added relative to methane gas or ethane gas, desired amounts of boron, nitrogen, and silicon can be added to the graphite. As for the nitrogen, after the graphite is fabricated and then allowed to stand under vacuum environment, the nitrogen can be introduced into the graphite alone or as a compound.

The gas containing boron, and at least either of nitrogen and silicon is not limited to a gas containing all these elements, and can be a gas combined with a gas containing at least any of these elements. Further, as the hydrocarbon gas, a hydrocarbon gas having a small number of carbon atoms is preferable, and in addition to the methane gas and ethane gas described above, ethylene gas, acetylene gas, and the like can be used. In the present embodiment, methane gas is most preferable as the hydrocarbon gas.

In first step S10, first, a base material is heated to a temperature of greater than or equal to 1200° C. and less than or equal to 2500° C. in a vacuum chamber. The degree of vacuum in the vacuum chamber is from 20 to 60 kPa. As the base material, any metal, inorganic ceramic material, or carbon material can be used so long as it is a material capable of withstanding a temperature approximately from 1200° C. to 2500° C.

From the viewpoint of not incorporating impurities in graphite, the base material is preferably made of carbon. More preferably, the base material is composed of diamond or graphite containing very small amount of impurities. In this case, the surface of the base material on the side where at least graphite is formed is preferably composed of diamond or graphite containing very small amount of impurities.

Then a gas containing boron and at least either of nitrogen and silicon, and a hydrocarbon gas are simultaneously introduced in the vacuum chamber under an atmosphere at a temperature of greater than or equal to 1200° C. and less than or equal to 2500° C. When the temperature in the vacuum chamber exceeds 2500° C., generation of a gas such as $C_2N_2$ or HCN, or the like is promoted, making it difficult to introduce a desired amount of nitrogen, which is not preferable. Further, the carbon and the silicon are allowed to react to thereby generate a carbon oxide gas, and the carbon oxide gas is then volatilized, which is not preferable. When the temperature in the vacuum chamber exceeds 2500° C., the nitrogen also tends to be volatilized.

Here, when the gas containing boron and at least either of nitrogen and silicon, and the hydrocarbon gas are simultaneously introduced, from the viewpoint of dispersing the boron, the nitrogen, and silicon in the graphite more uniformly as described above, and increasing yield of poly crystalline diamond, it is preferable that the above-mentioned gas mixture is previously formed and is then introduced. For example, when the gas containing boron and at least either of nitrogen and silicon, and the hydrocarbon gas are injected from separate nozzles, the yield of the polycrystalline diamond is less than 20%. In contrast to this, when the gas containing boron and at least either of nitrogen and silicon, and the hydrocarbon gas are mixed in a gas mixing chamber and the resulting gas mixture is injected from the same nozzle, the yield of the polycrystalline diamond is increased to greater than or equal to 80%.

The gas mixture is thermally decomposed at a temperature of greater than or equal to 1200° C. and less than or equal to 2500° C. and is fed toward the base material, so that the carbon, the boron, and at least either of the nitrogen and the silicon formed in atomic form by the thermal decomposition are allowed to react with one another on the base material to form graphite. The graphite is preferably a polycrystal containing a crystallized portion in at least a portion thereof, from the viewpoint of effective formation of the polycrystalline diamond.

The concentration of the trace impurities transition metal) in the graphite is preferably less than or equal to the detection limits of SIMS and ICP-MS (less than $10^{15}$ cm$^{-3}$). Further, from the viewpoint of having a grain size of from 1 to 500 nm, which is small, and forming polycrystalline diamond with uniform distribution of the boron, the nitrogen, and the silicon, the grain size of the graphite is preferably less than or equal to 10 μm, and more preferably less than or equal to 1 μm. From such a viewpoint, it is effective to form the graphite by a CVD method.

The density of the graphite is preferably greater than or equal to 0.8 g/cm$^3$, and more preferably greater than or equal to 1.4 g/cm$^3$ and less than or equal to 2.0 g/cm$^3$, from the viewpoint of improving yield by making volume change smaller during the conversion from the graphite to the polycrystalline diamond in the third step to be described later.

<Second Step>

Second step S20 is a step of filling the graphite in a vessel under an inert gas atmosphere. Since the graphite is filled in a predetermined vessel (e.g., a cell for high-pressure press) under an inert gas atmosphere, it is possible to suppress incorporation of trace impurities into the graphite and the polycrystalline diamond to be manufactured. Here, the inert gas may be a gas capable of suppressing incorporation of trace impurities, and for example, argon (Ar) gas, krypton (Kr) gas, helium (He) gas, and the like can be exemplified.

<Third Step>

Third step S30 is a step of converting the graphite to diamond by pressure heat treatment in the vessel. In particular, in third step S30, it is preferable that the graphite can be directly subjected to pressure heat treatment in a pressure apparatus, from the viewpoint of suppressing incorporation of trace impurities into polycrystalline diamond. This allows the graphite to be directly converted to polycrystalline diamond, that is, the graphite can be converted to polycrystalline diamond without adding a sintering aid, a catalyst, and the like. The pressure heat treatment refers to heat treatment under pressure.

The pressure heat treatment in third step S30 is preferably performed under conditions of greater than or equal to 6 GPa and greater than or equal to 1200° C. The pressure heat treatment is further preferably performed under conditions of greater than or equal to 8 GPa and less than or equal to 30 GPa, and greater than or equal to 1500° C. and less than or equal to 2300° C. Accordingly, polycrystalline diamond can be suitably manufactured, in which the boron is dispersed in the crystal grains at the atomic level, greater than or equal to 90 atomic % of all the boron is present in an isolated substitutional type, and at least either of the nitrogen and the silicon is present in an isolated substitutional type or an interstitial type. In the pressure heat treatment, there is no upper limit on the pressure, but the condition of a temperature of 2500° C. is the upper limit. The pressure heat treatment at greater than or equal to 6 GPa allows graphite to be directly converted to polycrystalline diamond. Further, the pressure heat treatment at a temperature of greater than or equal to 1200° C. also allows graphite to be directly converted to polycrystalline diamond. The pressure heat treatment at a temperature of less than or equal to 2500° C. allows graphite to be directly converted to polycrystalline diamond without volatilizing the elements. When the temperature exceeds 2500° C., the grain size of the polycrystalline diamond tends to exceed 500 nm.

Here, in the case of performing the pressure heat treatment in third step S30 under conditions of about 7 to 15 GPa, the polycrystalline diamond tends to be manufactured containing a graphene nanoribbon. In this case, it can be confirmed that the polycrystalline diamond contains a graphene nanoribbon, by confirming at least one of the polycrystalline diamond having a peak at a Raman shift of 1554 $cm^{-1}\pm20$ $cm^{-1}$ with a half width of less than or equal to 10 $cm^{-1}$ and the polycrystalline diamond having a peak at a Raman shift of 2330 $cm^{-1}\pm20$ cm with a half width of less than or equal to 6 $cm^{-1}$, in the Raman spectroscopic measurement.

Specifically, according to the present embodiment, polycrystalline diamond containing a graphene nanoribbon may be obtained depending on the conditions for the manufacturing method as described above. In this case, a graphene nanoribbon-derived protective film is formed on the surface of the polycrystalline diamond, thereby improving the sliding properties and reducing the dynamic friction coefficient, so that wear resistance can be improved.

In view of the above, by the method for manufacturing polycrystalline diamond according to the present embodiment, polycrystalline diamond having high oxidation resistance, high sliding properties, high wear resistance, and a low dynamic friction coefficient can be manufactured. The polycrystalline diamond is manufactured in any shape and any thickness with a diameter of approximately 15×15 t (t: thickness). For example, in the case where the graphite has a volume density of approximately 1.8 $g/cm^3$, the volume of the polycrystalline diamond is shrunk to 70 to 80% of that of the graphite by pressure heat treatment, but the polycrystalline diamond has the same shape or substantially the same shape as the graphite.

<Scribe Tool>

The scribe tool according to the present embodiment can be fabricated using the polycrystalline diamond.

The scribe tool according to the present embodiment can be fabricated by a conventional known method as long as the polycrystalline diamond is used.

<Scribe Wheel>

The scribe wheel according to the present embodiment can be fabricated using the polycrystalline diamond.

The scribe wheel according to the present embodiment can be fabricated by a conventional known method as long as the polycrystalline diamond is used.

<Dresser>

The dresser according to the present embodiment can be fabricated using the polycrystalline diamond.

The dresser according to the present embodiment can be fabricated by a conventional known method as long as the polycrystalline diamond is used.

<Rotating Tool>

The rotating tool according to the present embodiment can be fabricated using the polycrystalline diamond.

The rotating tool according to the present embodiment can be fabricated by a conventional known method as long as the polycrystalline diamond is used.

<Water Jet Orifice>

The water jet orifice according to the present embodiment can be fabricated using the polycrystalline diamond.

The water jet orifice according to the present embodiment can be fabricated by a conventional known method as long as the polycrystalline diamond is used.

<Wire Drawing Die>

The wire drawing die according to the present embodiment can be fabricated using the polycrystalline diamond.

The wire drawing die according to the present embodiment can be fabricated by a conventional known method as long as the polycrystalline diamond is used.

<Cutting Tool>

The cutting tool according to the present embodiment can be fabricated using the polycrystalline diamond.

The cutting tool according to the present embodiment can be fabricated by a conventional known method as long as the polycrystalline diamond is used.

<Electrode>

The electrode according to the present embodiment can be fabricated using the polycrystalline diamond.

The electrode according to the present embodiment can be fabricated by a conventional known method as long as the polycrystalline diamond is used.

<Processing Method>

In the processing method according to the present embodiment, an object can be processed using the polycrystalline diamond. In the processing method according to the present embodiment, the object is processed using the polycrystalline diamond, so that the object can be efficiently processed at low cost.

In the processing method according to the present embodiment, the object is preferably an insulator. In the processing method according to the present embodiment, the polycrystalline diamond has conductivity, so that even though the object is an insulator, it can be efficiently processed at low cost without generating abnormal wear and tear caused by triboplasma or the like.

The insulator preferably has a resistivity of greater than or equal to 100 kΩ·cm. The upper limit of the resistivity of the insulator is infinite (∞). In the present embodiment, even though the object is an insulator having a resistivity of greater than or equal to 100 kΩ·cm, it can be efficiently processed at low cost without etching caused by triboplasma.

EXAMPLES

Hereinafter, the present invention will be described more in detail by way of examples, but the present invention is not limited to the examples.

Example 1

Manufacturing of Polycrystalline Diamond (Manufacturing of Four Polycrystalline Diamonds)

In Example 1, four polycrystalline diamonds (B-NPD-I, B-NPD-II, B-NPD-III, B-NPD-IV) used in Examples 2 to 4 to be described later were manufactured. These polycrystalline diamonds correspond to Examples.

I. Preparation of Graphite Containing Boron, Nitrogen, and Silicon

A degree of vacuum within a CVD apparatus was reduced to less than or equal to $1\times10^{-2}$ Pa, and the CVD apparatus was thereafter filled with an argon gas serving as an inert gas to create an atmosphere of 20 kPa. A gas mixture containing diborane, methane, and at least either of nitrogen and silicon at a predetermined ratio and also containing argon as the remainder was introduced on a base material. Then, the gas mixture was allowed to react on a base material at a base-material temperature of 1750° C. so that graphite was grown to have a thickness of 20 mm. This procedure was repeated for manufacturing four polycrystalline diamonds.

2. Housing of Graphite in Vessel

The graphite was processed into a tablet form, and thereafter encapsulated in a vessel (a cell for high-pressure press: φ10×10 t cylindrical shape).

3. Conversion from Graphite to Polycrystalline Diamond

The vessel in which the graphite was encapsulated was placed in a pressure heat treatment apparatus, and then subjected to pressure heat treatment under conditions of 16 GPa and 2100° C., so that the graphite was directly converted to polycrystalline diamond. It was confirmed by X-ray and electron diffraction apparatus that each of the four polycrystalline diamonds thus obtained had a diamond single phase as basic composition, did not contain a binding phase, and did not have a different phase made of $B_4C$ or the like. Further, regarding the four polycrystalline diamonds, TEM, SIMS, and TOF-SIMS were used to confirm that the boron was dispersed at an atomic level, greater than or equal to 90 atomic % of all the boron was present in an isolated substitutional type, and to confirm that the atomic concentration of the boron. The presence of the nitrogen and the silicon in an isolated substitutional type or an interstitial type, and their atomic concentrations were confirmed using TOF-SIMS.

Specifically, the dispersed state of the boron at the atomic level by TEM was confirmed by a conventional known method.

SIMS was used to measure the atomic concentrations of the boron, the nitrogen, and the silicon, and the atomic concentration of the trace impurities inside the polycrystalline diamond under the following conditions.
Measuring apparatus: Trade name (product number): "IMS-7f", manufactured by AMETEK Inc.
Primary ion species: Cesium (Cs)
Primary acceleration voltage: 15 kV
Detection area: 30 (μm φ)
Measurement accuracy: ±40% (2σ)

TOF-SIMS was used to perform analysis under the following conditions so as to confirm that each of the elements is "dispersed at the atomic level" and that each of the elements is in an "isolated substitutional type" or an "interstitial type".

Measuring apparatus: A time-of-flight secondary ion mass spectrometer Tof-SIMS)
Primary ion source: Bismuth (Bi)
Primary acceleration voltage: 25 kV Further, the concentration of the trace impurities formed of elements other than the carbon, the boron, the nitrogen, and the silicon was measured using SIMS under the above conditions. In addition, the resistivity and the Knoop hardness were measured by the above-mentioned method, and the oxidation start temperature in the air was measured by a conventional known method. These measurement results are shown in Table 1. In the above four polycrystalline diamonds, trace impurities were not detected by SIMS.

(Manufacturing of NPD, Ib-type SCD, and PCD)

In Example 1, polycrystalline diamond (NPD) that is an insulator having less than $2\times10^{19}$ $cm^{-3}$ boron added in a non-isolated substitutional type (an interstitial type), Ib-type single-crystal diamond (Ib-type SCD), and sintered diamond (PCD) having a grain size of 3 to 5 μm formed by bonding diamond particles with a binder containing cobalt and then sintering the bonded particles were fabricated as comparative examples. Regarding these comparative examples, the same method as for the four polycrystalline diamonds was performed to measure the concentration of boron or the like, Knoop hardness, and resistivity. These measurement results are also shown in Table 1.

TABLE 1

| Sample type | Structure | Amount of boron ($cm^{-3}$) | Nitrogen ($cm^{-3}$) | Silicon ($cm^{-3}$) | Resistivity (mΩ · cm) | Knoop hardness (GPa) | Oxidation start temperature in the air (° C.) |
|---|---|---|---|---|---|---|---|
| NPD (Ground raw material mixture) | Diamond single phase | $<2 \times 10^{19}$ (Interstitial type) | $2 \times 10^{19}$ | $2 \times 10^{18}$ | Insulator (∞) | 130 | 700 |
| B-NPD-I | Diamond single phase | $2 \times 10^{19}$ | $1 \times 10^{18}$ | — | 20000 | 120-130 | 800 |
| B-NPD-II | Diamond single phase | $5 \times 10^{20}$ | — | $5 \times 10^{19}$ | <20 | 90-100 | 900 |
| B-NPD-III | Diamond single phase | $5 \times 10^{20}$ | $8 \times 10^{19}$ | $2 \times 10^{20}$ | 20 | 120-130 | 900 |
| B-NPD-IV | Diamond single phase | $1 \times 10^{21}$ | $2 \times 10^{19}$ | $2 \times 10^{20}$ | <20 | 80-100 | 1000 |
| Ib-type SCD | Diamond single phase | $2 \times 10^{16}$ | $1.9 \times 10^{19}$ | — | Insulator (∞) | 80-100 (100) faces | 700 |
| PCD | Combined with binding phase (Co) | $2 \times 10^{16}$ | — | — | — | 50 | 400 |

Example 2

Evaluation of Wear Resistance (Thermochemical Wear Properties)

In Example 2, the above four polycrystalline diamonds, Ib-type SCD, and NPD were used to fabricate cutting tools by a known manufacturing method, quartz glass having a Vickers hardness (Hv) of 9 GPa was cut as a work material, and wear resistance was evaluated. The cutting tools thus fabricated had a shape classified as a generalized throwaway tip, and any of them were an R bites cutting tool having a corner R of 0.8 mm, a relief angle of 7°, and a rake angle of 0°.

In the evaluation of the wear resistance, each of the above-described cutting tools was set in an ultraprecision lathe, and when the work material was cut by 5000 m at a cutting speed (Vc) of 100 to 200 m/min (low speed condition: 100 m/min, high speed condition: 200 m/min), a feed (f) of 0.001 mm/rot., and a depth of cut (ap) of 0.005 mm (at low speed condition) and 0.001 mm (at high speed condition), a wear width of a flank face Vb (unit: mm) was measured. The results are shown in Table 2.

TABLE 2

| | Wear width of flank face Vb (mm) | | | | | |
|---|---|---|---|---|---|---|
| | Ib-type SCD | NPD | B-NPD-I | B-NPD-II | B-NPD-III | B-NPD-IV |
| Low speed | 0.045 | 0.035 | 0.029 | 0.032 | 0.025 | 0.028 |
| High speed | 0.025 | 0.029 | 0.015 | 0.038 | 0.010 | 0.03 |

According to Table 2, the cutting tool including the Ib-type SCD had a large amount of wear at the slow speed condition, and the cutting tools of the four polycrystalline diamonds and the cutting tool using the NPD of comparative example had approximately the same amount of wear. At the high speed condition, the cutting tool including the Ib-type SCD and the cutting tool including the NPD had large amounts of wear, while the cutting tool of B-NPD-II in the four polycrystalline diamonds had a large amount of wear, but those of the other polycrystalline diamonds had extremely small amounts of wear. It was assumed that these results were attributed to the effect of the protective film formed on the surfaces of the four polycrystalline diamonds to exhibit lubricity to the quartz, so that reaction wear between the diamond and the quartz was suppressed.

Example 3

Evaluation of Wear Resistance (Mechanical Wear Properties)

In Example 3, B-NPD-I and B-NPD-III of the four polycrystalline diamonds, and NPD and PCD as comparative examples were used to fabricate cutting tools by a known manufacturing method, a high-purity sintered alumina body (purity: 99.9% by mass) having a Vickers hardness (Hv) of 16 GPa was cut as a work material, and wear resistance was evaluated. The cutting tools thus fabricated had a shape classified as a generalized throw-away tip, and any of them had a corner R of 0.4 mm and a relief angle of 0°.

Figure 3:
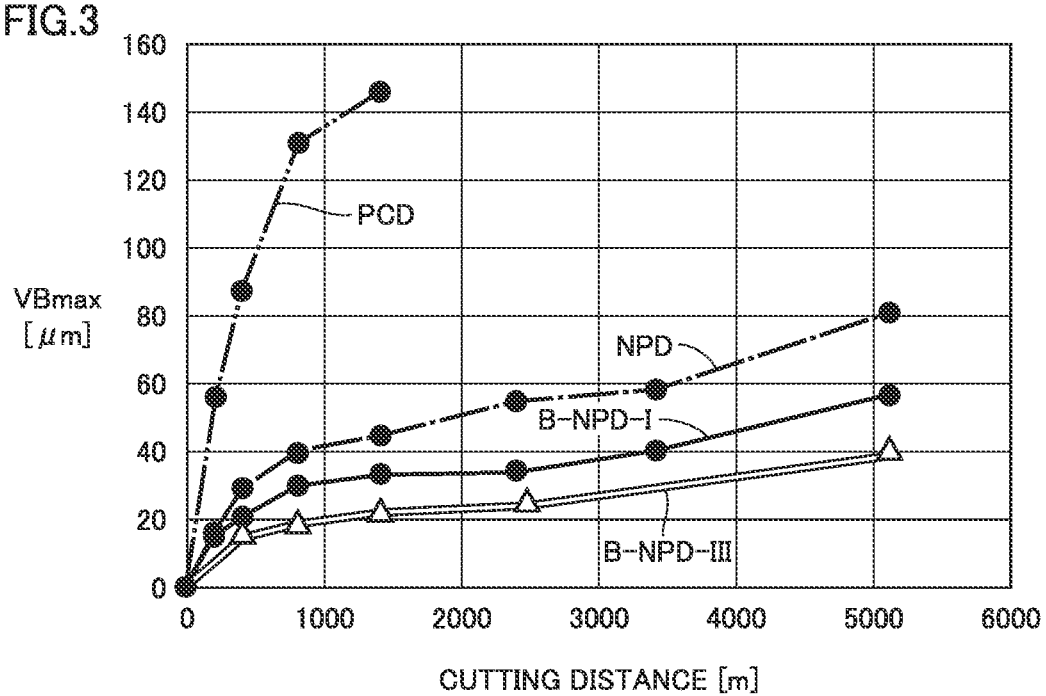
FIG. 3 is a graph showing change in an amount of wear of a polycrystalline diamond-made cutting tool relative to a cutting distance when high-purity alumina (purity: 99.9% by mass) is used as a work material.

In the evaluation of the wear resistance, each of the above-described cutting tools was set in an ultraprecision lathe, and the maximum amount of wear (VBmax) (unit: μm) relative to the cutting distance (m) was measured under the following conditions. The results are shown in FIG. 3.
Work material: KYOCERA A479 φ50 mm sintered body, turning
Cutting condition: Cutting speed (Vc): 300 m/min, feed (f): 0.01 mm, depth of cut (ap): 0.01 mm, dry/wet: wet method.

As shown in FIG. 3, the cutting tool including PCD had the maximum amount of wear exceeding 100 μm in a cutting distance of approximately 600 m. In contrast to this, the cutting tool including the NPD had the maximum amount of wear not exceeding 100 μm even though the cutting distance exceeds 5000 m. Further, the cutting tool of B-NPD-I showed wear resistance 1.5 times higher than that of NPD, and the cutting tool of B-NPD-III showed wear resistance 2 to 2.5 times higher than that of NPD.

Example 4

Evaluation of Life by Cutting of Insulator

In Example 4, the above four polycrystalline diamonds, Ib-type SCD, and NPD were used to fabricate cutting tools by a known manufacturing method, polycarbonate (resistivity: ∞ kΩ·cm) was cut as a work material, and the life of the cutting edge was evaluated. The cutting tools thus fabricated had a shape of an R bites cutting tool having a corner R of 0.8 mm, a relief angle of 7°, and a rake angle of 7°.

In the evaluation of the life of the cutting edge in Example 4, each of the above-described cutting tools was set in an ultraprecision lathe, and then cut by 4.5 km under the following conditions. Thereafter, finish cutting was performed, a degree of damage on the cutting edge was then evaluated, and the lives of the cutting edges of the respective cutting tools were calculated based on the degree of damage. Specifically, when the life of the cutting tool including the Ib-type SCD was set to 1, the lives of the other cutting tools were relatively evaluated. The results are shown in Table 3.
Work material: Polycarbonate (Takiron PCP1609A).
Cutting Condition:
(1) Cutting of 4.5 km: Cutting speed (V): 100 to 400 m/min, feed (1: 0.04 mm/rot., depth of cut (ap): 0.2 mm.
(2) Finish cutting: Cutting speed (V): 75 m/min, feed (t): 0.002 mm/rot., depth of cut (ap): 0.002 mm, dry/wet: dry method.

TABLE 3

| Cutting life of polycarbonate (single crystal is set to 1) | | | | | |
|---|---|---|---|---|---|
| Ib-type SCD | NPD | B-NPD-I | B-NPD-II | B-NPD-III | B-NPD-IV |
| 1 | 1 | 3.0 | 2.8 | 4.5 | 4.3 |

According to Table 3, when the life of the cutting tool including the Ib-type SCD was set to 1, the life of the cutting tool including the NPD was 1, but the lives of the cutting tools of the four polycrystalline diamonds were greater than or equal to 2.8, which showed good life. It was assumed that these results were attributed to the effect of the protective film formed on the surfaces of the four polycrystalline diamonds and the conductivity of the four polycrystalline diamonds to suppress wear and tear caused by triboplasma in the insulating work material such as polycarbonate, and the effect to exhibit lubricity, so that wear was suppressed.

Example 5

Evaluation with Various Tools

<Fabrication of Polycrystalline Diamond>
Polycrystalline diamonds (B-NPD-V to IX) using in the evaluation with various tools to be described later were manufactured by the same method as in Example 1, and polycrystalline diamonds (NPD-I to III) to which boron was added in a non-isolated substitutional type (an aggregated form) were manufactured by a conventional known method. The methods of confirming that the polycrystalline diamond had a diamond single phase as basic composition, the boron was dispersed at an atomic level, greater than or equal to 90 atomic % of all the boron was present in an isolated substitutional type, and the nitrogen and the silicon were present in an isolated substitutional type or an interstitial type were also the same as those in Example 1. Further, the atomic concentrations of the carbon, the boron, the nitrogen, the silicon, and the trace impurities were measured under the same conditions as in Example 1 by SIMS. In the polycrystalline diamonds (B-NPD-V to IX), however, the trace impurities were not detected.

These measurement results are shown in Table 4. Further, it was confirmed from the half width for the (111) peak with an X-ray diffractometer (XRD) that these polycrystalline diamonds had crystal grain sizes of 30 to 60 nm.

TABLE 4

| (Material) type of polycrystalline diamond | Boron (cm$^{-3}$) | Nitrogen (cm$^{-3}$) | Silicon (cm$^{-3}$) |
| --- | --- | --- | --- |
| NPD-I | $1 \times 10^{14}$ (Aggregated form) | $3 \times 10^{19}$ | $5 \times 10^{17}$ |
| NPD-II | $1 \times 10^{18}$ (Aggregated form) | $4.4 \times 10^{19}$ | $5 \times 10^{17}$ |
| NPD-III | $1 \times 10^{19}$ (Aggregated form) | $1 \times 10^{20}$ | $5 \times 10^{18}$ |
| B-NPD-V | $1 \times 10^{17}$ | $1 \times 10^{17}$ | $2 \times 10^{15}$ |
| B-NPD-VI | $1 \times 10^{18}$ | $3 \times 10^{18}$ | $2 \times 10^{18}$ |
| B-NPD-VII | $1 \times 10^{19}$ | $1 \times 10^{17}$ | $5 \times 10^{16}$ |
| B-NPD-VIII | $1 \times 10^{20}$ | $3 \times 10^{18}$ | $1 \times 10^{18}$ |
| B-NPD-IX | $1 \times 10^{21}$ | $1 \times 10^{18}$ | $2 \times 10^{20}$ |

(Raman Spectroscopic Measurement)

The Raman spectroscopic measurement was performed for the polycrystalline diamonds of NPD-I, B-NPD-V, and B-NPD-VI as described above, using a Raman spectrophotometer (trade name: Raman microscope "RAMANtouch", manufactured by Nanophoton). The conditions for the measurement are as follows.

Figure 4:
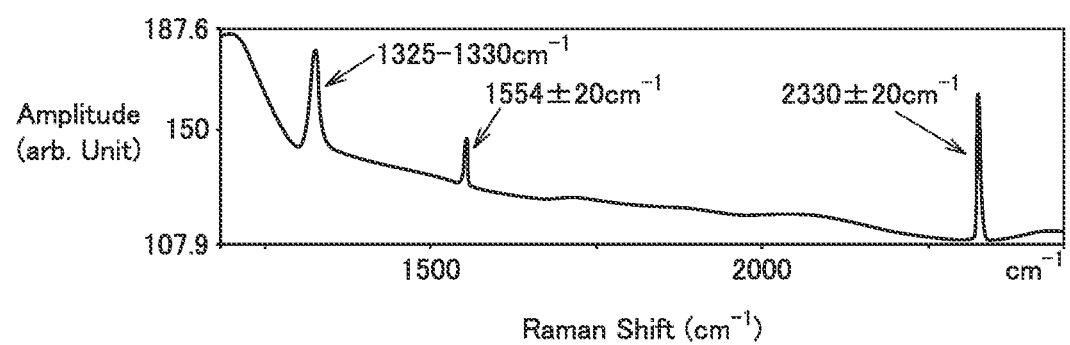
FIG. 4 is a spectrum showing that in the Raman spectroscopic measurement of the polycrystalline diamond of B-NPD-VI, peaks of a graphene nanoribbon appear at a Raman shift of 15545 20 $cm^{-1}$ with a half width within 10 $cm^{-1}$ and at a Raman shift of 2330±20 $cm^{-1}$ with a half width within 6 $cm^{-1}$.

Wavenumber measurement range: From 1200 to 1700 cm$^{-1}$
(532 nm excitation)
Resolution: Spectral pixel resolution 0.36 cm$^{-1}$ Further, the dynamic friction coefficients of these polycrystalline diamonds were determined by the above-described measurement method (pin-on-disk sliding test). These measurement results (shift (peak) position and line width (half width), presence or absence of graphene nanoribbon, dynamic friction coefficient) are shown in Table 5. Further, the Raman spectrum obtained for the B-NPD-VI is shown in FIG. 4. According to FIG. 4, it is understood that the B-NPD-VI contains a graphene nanoribbon because peaks of the graphene nanoribbon appear at a Raman shift of 1554 cm$^{-1}$±20 cm$^{-1}$ with a half width within 10 cm$^{-1}$ and at a Raman shift of 2330 cm$^{-1}$±20 cm$^{-1}$ with a half width within 6 cm$^{-1}$. Further, Table 5 showed that each of the B-NPD-V and B-NPD-VI contained a graphene nanoribbon, so that their dynamic friction coefficients were an order of magnitude lower than that of the NPD-I. In Table 5, the "nanoribbon" means a graphene nanoribbon, and the "coefficient of friction" means a dynamic friction coefficient.

TABLE 5

| | Presence/ absence of nanoribbon | 1554 ± 20 cm$^{-1}$ | | 2330 ± 20 cm$^{-1}$ | | Coefficient of Friction |
| --- | --- | --- | --- | --- | --- | --- |
| | | Shift (peak) | Line Width (half width) | Shift (peak) | Line Width (half width) | |
| NPD-I | Absence | | | | | 0.2 |
| B-NPD-V | Presence | 1554.1 | 6.13 | 2328.1 | 3.64 | 0.02 |
| B-NPD-VI | Presence | 1553.2 | 7.0 | 2327.2 | 3.7 | 0.02 |

(Fabrication and Evaluation of Scribe Tool)

The NPD-II and the B-NPD-VI were used to fabricate scribe tools each having four points at a tip end (having a quadrangular two-dimensional shape). These scribe tools were used to form 200 scribe grooves each having a length of 50 nm in a sapphire substrate at a load of 20 gf. Thereafter, an amount of wear of the tip end portion of the scribe tool was observed with an electron microscope. As a result, the amount of wear of the scribe tool using the B-NPD-VI was 0.1 times, which was extremely small, as compared with that of the NPD-II. The same effect was observed hi the scribe wheels fabricated using each of the NPD-II and the B-NPD-VI.

Further, the NPD-I was used to fabricate a scribe tool having four points at a tip end (having a quadrangular two-dimensional shape), and by using the same method as described above, amounts of wear of the tip end portions of the scribe tools using each of the NPD-I and the B-NPD-VI were compared. As a result, the amount of wear of the scribe tool using the B-NPD-VI was 0.8 times, which was small, as compared with that of the scribe tool using the NPD-I. The same effect was observed in the scribe wheels fabricated using each of the NPD-I and the B-NPD-VI.

(Fabrication and Evaluation of Dresser)

The NPD-II and the B-NPD-VI were used to fabricate dressers each having a single point at a tip end (having a conical shape). These dressers were worn with a wet method by using a white alumina (WA) grindstone under such conditions as a peripheral speed of the grindstone of 30 m/sec, and a depth of cut of 0.05 mm. Thereafter, an amount of wear of the dresser was measured with a height gauge. As a result, the amount of wear of the dresser using the B-NPD-VI was 0.1 times, which was extremely small, as compared with that of the dresser using the NPD-II.

(Fabrication and Evaluation of Minute Rotating Tool (Miniature Drill))

The NPD-II and the B-NPD-VI were used to fabricate miniature drills each having a diameter of φ1 mm and a blade length of 3 mm. These miniature drills were used to drill a hole through a 1.0 nun-thick plate made of cemented carbide (WC—Co) (composition: 12% by mass of Co, the remainder was WC) under such conditions as a number of revolutions of 4000 rpm and a feed rate of 2 μm/rev. The number of holes (the number of drilling operations) that could be drilled until the drills were worn or broken was evaluated. As a result, the number of drilling operations by the miniature drill using the B-NPD-VI was 10 times larger than that by the miniature drill using the NPD-II.

Example 6

Evaluation of Cutting Tool I

In Example 6, the same method as in Example 1 was used to prepare graphite having a bulk density of 2.0 g/cm$^3$ and a boron concentration of $1 \times 10^{21}$ cm$^{-3}$ measured by ICP-MS under the conditions described above. Such graphite was directly converted to polycrystalline diamond by pressure heat treatment under conditions of 15 GPa and 2200° C. using an isotropic high pressure generator. The resulting polycrystalline diamond had a grain size of 10 nm to 100 nm. No precipitation of $B_4C$ was observed in X-ray diffraction patterns. According to the measurement by SIMS under the same conditions as in Example 1, the silicon concentration was $1 \times 10^{18}$ cm$^{-3}$, and the nitrogen concentration was $2.5 \times 10^{18}$ cm$^{-3}$. The boron concentration was $1 \times 10^{21}$ cm$^{-3}$.

The polycrystalline diamond thus obtained was used to fabricate a main body of a cutting tool by a conventional known method. The polycrystalline diamond was joined to the main body of the cutting tool with the use of an active brazing material in an inert atmosphere, and the surface of the polycrystalline diamond was then polished. Thereafter, a flank face was cut through electric discharge machining, to thereby fabricate an R bites cutting tool I (testing tool 1) having a corner R of 0.4 mm, a relief angle of 11°, and a rake angle of 0°, and a flank face was further processed by polishing to thereby fabricate an R bites cutting tool I (testing tool 2) having a corner R of 0.4 mm, a relief angle of 11°, and a rake angle of 0°. As a comparative example, sintered diamond containing a conventional cobalt (Co) binder was used to fabricate a cutting tool (comparative tool A) by a conventional known method, and an R bites cutting tool having the same shape as testing tool 1 was provided through electric discharge machining in the same manner as for testing tool 1. Further, polycrystalline diamond with no element added was used to fabricate a cutting tool (comparative tool B) and a tool (comparative tool C) including Ib-type single-crystal diamond by a conventional known method, and their flank faces were processed by polishing in the same manner as for testing tool 2 to provide an R bites cutting tool having the same shape as testing tool 2. Accuracy of a ridge line of a cutting edge made through electric discharge machining was approximately from 2 to 5 μm in comparative tool A, and was less than or equal to 0.5 μm in testing tool 1, which was good. In addition, accuracy of a ridge line of a cutting edge made by polishing was 0.1 μm in testing tool 2, which was good. A processing time for testing tool 1 was equivalent to that for comparative tool A.

Next, with testing tools 1 and 2, and comparative tools A to C, an intermittent cutting evaluation test was performed by turning under the following conditions.
Shape of tool: Corner R of 0.4 mm, a relief angle of 11°, and a rake angle of 0°
Work material: Material—aluminum alloy A390 (Shape: Diameter φ100×500 mm with four U-shaped grooves Processing method: Intermittent turning of an outer circumference of a cylinder method)
Cutting fluid: Water-soluble emulsion
Cutting condition: Cutting speed (Vc)=800 m/min, depth of cut (ap)=0.2 mm, feed rate (1)=0.1 mm/rev.
Cutting distance: 10 km After the intermittent cutting evaluation test as described above was performed, the cutting edge of each of the tools was observed, and a state of wear and tear was checked. As a result, in comparative tool A, an amount of wear of a flank face was as great as 45 μm, and a shape of the cutting edge was lost, whereas in testing tool 1, an amount of wear of a flank face was 2 μm, which was satisfactory. Further, testing tool 2 had an amount of wear of 0.5 μm, and it was much better than comparative tool B having an amount of wear of 3.5 μm and comparative tool C having an amount of wear of 3.5 μm.

Example 7

Evaluation of Cutting Tool II

In Example 7, the same method as in Example 1 was used, except that a gas mixture containing trimethylboron, methane, nitrogen, and silicon was introduced, so that graphite having a bulk density of 2.0 g/cm$^3$ and a boron concentration of 1×10$^{19}$ cm$^{-3}$ measured by SIMS under the same conditions as in Example 1 was prepared. Such graphite was directly converted to polycrystalline diamond by pressure heat treatment under conditions of 15 GPa and 2200° C. using an isotropic high pressure generator. The resulting polycrystalline diamond had a grain size of 10 nm to 100 nm. No precipitation of $B_4C$ was observed in X.-ray diffraction patterns. According to the measurement by SIMS under the same conditions as in Example 1, the silicon concentration was 1×10$^{18}$ cm$^{-3}$, and the nitrogen concentration was 2.5×10$^{18}$ cm$^{-3}$. The boron concentration was 1×10$^{19}$ cm$^{-3}$.

The polycrystalline diamond thus obtained was used to fabricate a main body of a cutting tool by a conventional known method. The polycrystalline diamond was joined to the main body of the cutting tool with the use of an active brazing material in an inert atmosphere, and the surface of the polycrystalline diamond was then polished. Thereafter, a flank face was further processed by polishing to thereby fabricate an R bites cutting tool II (testing tool 3) having a corner R of 0.4 mm, a relief angle of 11°, and a rake angle of 0°. As a comparative example, the same comparative tools A to C as used in Example 6 were prepared. Accuracy of a ridge line of a cutting edge of testing tool 3 was less than or equal to 0.1 μm, which was good.

In Example 7, the intermittent cutting evaluation test was performed with testing tool 3 under the same conditions as in Example 6. As a result, the amount of wear of testing tool 3 was 0.1 μm, which was very good as compared with that of each of comparative tools A to C.

Example 8

Evaluation of Cutting Tool III

In Example 8, a gas mixture containing diborane, methane, nitrogen and silicon was introduced in a reaction vessel, and graphite was fabricated while the degree of vacuum in the chamber was kept constant at 26.7 kPa. Thereafter, the degree of vacuum was reduced to less than or equal to 10$^{-2}$ Pa, the atmospheric temperature was cooled to 300° C., and a gas mixture containing silicon and nitrogen was further introduced to the graphite at 1 standard cubic centimeter per minute (sccm). Thus, graphite having a bulk density of 1.9 g/cm$^3$, a boron concentration of 1×10$^{21}$ cm$^{-3}$ measured under the same conditions as in Example 1 by SIMS was prepared. Such graphite was directly converted to polycrystalline diamond by pressure heat treatment under conditions of 15 GPa and 2200° C. using an isotropic high pressure generator. The resulting polycrystalline diamond had a grain size of 10 nm to 100 nm. This polycrystalline diamond had a Knoop hardness of 120 GPa. A test piece having a size of 3 mm×1 mm was cut from the polycrystalline diamond, and resistivity of the test piece was measured by the above-described method. The resistivity resulted in 1 mΩ·cm. According to the measurement by SIMS under the same conditions as in Example 1, the silicon concentration was 1×10$^{18}$ cm$^{-3}$, and the nitrogen concentration was 2.5×10$^{18}$ cm$^{-3}$. The boron concentration was 1×10$^{21}$ cm$^{-3}$.

The polycrystalline diamond thus obtained was used to fabricate a main body of a cutting tool by a conventional known method. The polycrystalline diamond was joined to the main body of the cutting tool with the use of an active brazing material in an inert atmosphere, and the surface of the polycrystalline diamond was then polished. Thereafter, a flank face was cut through electric discharge machining, to thereby fabricate a ball end mill (testing tool 4) having a diameter of φ0.5 nun with two twisted cutting blades. As a comparative example, using sintered diamond containing a conventional cobalt (Co) binder, a flank face was cut through electric discharge machining in the same manner as for testing tool 4, to thereby fabricate a ball end mill (comparative tool A-2) having the same shape as testing tool 4.

Further, using polycrystalline diamond with no element added, a flank face was cut by laser machining to thereby fabricate a ball end mill (comparative tool B-2) having the same shape as testing tool 4, and the flank face was locally polished to finish a cutting edge grade to have a surface roughness of Ra 30 nm.

In Example 8, with testing tool 4, and comparative tools A-2 and B-2, a cutting evaluation test was performed under the following conditions.
Shape of tool: φ0.5 mm double-bladed ball end mill
Work material: Material—STAVAX cemented carbide (WC-12% Co)
Cutting fluid: Kerosene
Cutting condition: Tool revolution speed of 420000 rpm, depth of cut (ap)=0.003 mm, feed rate (f)=120 mm/min When the cutting evaluation test was performed, the tool life of testing tool 4 was 5 times as long as that of comparative tool A-2 and 1.5 times as long as that of comparative tool B-2, which was very good. The same effect was obtained with an aqueous cutting fluid.

Example 9

Evaluation of Orifice I for Water Jet

In Example 9, the same method as in Example 1 was used to prepare graphite having a bulk density of 2.0 g/cm$^3$ and a boron concentration of $1\times10^{19}$ cm$^{-3}$ measured by ICP-MS under the conditions described above. Such graphite was directly converted to polycrystalline diamond by pressure heat treatment under conditions of 15 GPa and 2200° C. using an isotropic high pressure generator. The resulting polycrystalline diamond had the maximum grain size of 100 nm. No precipitation of B$_4$C was observed in X-ray diffraction patterns. According to the measurement by SIMS under the same conditions as in Example 1, the silicon concentration was $1\times10^{18}$ cm$^{-3}$, and the nitrogen concentration was $2.5\times10^{18}$ cm$^{-3}$. The boron concentration was $1\times10^{19}$ cm$^{-3}$.

The polycrystalline diamond thus obtained was used to fabricate an orifice I for water jet having a φ300 µm-diameter orifice hole by a conventional known method. As a comparative example, Ib-type SCD fabricated by a conventional known method was used to fabricate a Ib-type SCD orifice for water jet having the same orifice hole as orifice I for water jet. Further, polycrystalline diamond with no element added that had been fabricated by a conventional known method was used to fabricate an orifice for water jet which was composed of the polycrystalline diamond with no element added and had the same orifice hole as orifice I for water jet.

Using these orifices for water jet, a cutting time period until the diameter of the orifice hole extended to φ350 µm was counted under conventional known conditions, to thereby evaluate cutting performance. As a result, the cutting time period of orifice I for water jet in Example 9 was 5 times as long as that of the Ib-type SCD orifice for water jet. Further, the cutting time period thereof was twice as long as that of the water jet orifice of the polycrystalline diamond with no element added.

Example 10

Evaluation of Orifice II for Water Jet

In Example 10, the same method as in Example 1 was used to prepare graphite having a bulk density of 2.0 g/cm$^3$ and a boron concentration of $1\times10^{19}$ cm$^{-3}$ measured by ICP-MS under the conditions described above. Such graphite was directly converted to polycrystalline diamond by pressure heat treatment under conditions of 15 GPa and 2200° C. using an isotropic high pressure generator. The resulting polycrystalline diamond had the maximum grain size of 200 nm. No precipitation of B$_4$C was observed in X-ray diffraction patterns. According to the measurement by SIMS under the same conditions as in Example 1, the silicon concentration was $1\times10^{18}$ cm$^{-3}$, and the nitrogen concentration was $2.5\times10^{18}$ cm$^{-3}$. The boron concentration was $1\times10^{19}$ cm$^{-3}$.

The polycrystalline diamond thus obtained was used to fabricate a rectangular orifice for water jet having a short side of 150 µm and a long side of 300 µm by a conventional known method. As a comparative example, PCD fabricated by a conventional known method was used to fabricate a PCD orifice for water jet having the same shape as orifice II for water jet. Further, polycrystalline diamond with no element added that had been fabricated by a conventional known method was used to fabricate an orifice of the polycrystalline diamond with no element added, having the same shape as orifice II for water jet.

Using these orifices for water jet, a cutting time period until the long side of the orifice extended to 400 µm was counted under conventional known conditions, to thereby evaluate cutting performance. As a result, the cutting time period of orifice II for water jet in Example 10 was 40 times as long as that of the PCD orifice for water jet. The cutting time period thereof was twice as long as that of the water jet orifice of the polycrystalline diamond with no element added.

While the embodiments and examples of the present invention have been described above, it is conceived from the beginning that the configurations of the embodiments and examples are appropriately combined.

The embodiment and examples disclosed herein are merely an exemplification in every respect and should not be considered as limitative. The scope of the present invention is given by claims rather than the above-described embodiments and examples, and intended to include meanings equivalent to claims, and all changes within the scope of claims.

REFERENCE SIGNS LIST

S10: First step, S20: Second step, S30: Third step

The invention claimed is:
1. Polycrystalline diamond having a diamond single phase as basic composition, wherein
the polycrystalline diamond includes a plurality of crystal grains,
the polycrystalline diamond contains boron, at least either of nitrogen and silicon, and a remainder including carbon and trace impurities,
the boron is dispersed in the crystal grains at an atomic level, and greater than or equal to 90 atomic % of all the boron is present in an isolated substitutional type,
the nitrogen and the silicon are present in an isolated substitutional type or an interstitial type in the crystal grains,
each of the crystal grains has a grain size of less than or equal to 500 nm,
the polycrystalline diamond has a surface covered with a protective film, and
the polycrystalline diamond contains a graphene nanoribbon.

2. The polycrystalline diamond according to claim 1, wherein greater than or equal to 99 atomic % of all the boron is present in an isolated substitutional type in the crystal grains.

3. The polycrystalline diamond according to claim 1, wherein the boron has an atomic concentration of greater than or equal to $1\times10^{14}$ cm$^{-3}$ and less than or equal to $1\times10^{22}$ cm$^{-3}$.

4. The polycrystalline diamond according to claim 1, wherein the nitrogen has an atomic concentration of greater than or equal to $1\times10^{18}$ cm$^{-3}$ and less than or equal to $1\times10^{20}$ cm$^{-3}$.

5. The polycrystalline diamond according to claim 1, wherein the silicon has an atomic concentration of greater than or equal to $1\times10^{18}$ cm$^{-3}$ and less than or equal to $2\times10^{20}$ cm$^{-3}$.

6. The polycrystalline diamond according to claim 1, wherein in a Raman spectroscopic measurement of the polycrystalline diamond, a peak area around 1575 cm$^{-1}$±30 cm$^{-1}$ with a half width of greater than 10 cm$^{-1}$ and less than or equal to 20 cm$^{-1}$ is less than 1% of a peak area around 1300 cm$^{-1}$±30 cm$^{-1}$ with a half width of less than or equal to 60 cm$^{-1}$.

7. The polycrystalline diamond according to claim 1, wherein the polycrystalline diamond has a dynamic friction coefficient of less than or equal to 0.2.

8. The polycrystalline diamond according to claim 1, wherein the polycrystalline diamond has a dynamic friction coefficient of less than or equal to 0.1.

9. The polycrystalline diamond according to claim 1, wherein the protective film contains at least silicon oxide or boron nitride.

10. The polycrystalline diamond according to claim 9, wherein the protective film contains a precipitate precipitated out of the crystal grains.

11. The polycrystalline diamond according to claim 1, wherein the protective film has an average film thickness of greater than or equal to 1 nm and less than or equal to 1000 nm.

12. The polycrystalline diamond according to claim 1, wherein the polycrystalline diamond has a peak at a Raman shift of 1554 cm$^{-1}$±20 cm$^{-1}$ with a half width of less than or equal to 10 cm$^{-1}$ in the Raman spectroscopic measurement.

13. The polycrystalline diamond according to claim 1, wherein the polycrystalline diamond has a peak at a Raman shift of 2330 cm$^{-1}$±20 cm$^{-1}$ with a half width of less than or equal to 6 cm$^{-1}$ in the Raman spectroscopic measurement.

14. A scribe tool formed using the polycrystalline diamond according to claim 1.

15. A scribe wheel formed using the polycrystalline diamond according to claim 1.

16. A dresser formed using the polycrystalline diamond according to claim 1.

17. A rotating tool formed using the polycrystalline diamond according to claim 1.

18. An orifice for water jet formed using the polycrystalline diamond according to claim 1.

19. A wire drawing die formed using the polycrystalline diamond according to claim 1.

20. A cutting tool formed using the polycrystalline diamond according to claim 1.

21. An electrode formed using the polycrystalline diamond according to claim 1.

22. A processing method comprising processing an object using the polycrystalline diamond according to claim 1.

23. The processing method according to claim 22, wherein the object is an insulator.

24. The processing method according to claim 23, wherein the insulator has a resistivity of greater than or equal to 100 kΩ·cm.

* * * * *